United States Patent
Hitosugi et al.

(10) Patent No.: US 7,968,216 B2
(45) Date of Patent: Jun. 28, 2011

(54) INTERNAL GEAR PUMP

(75) Inventors: Taro Hitosugi, Yamato (JP); Yutaka Furubayashi, Kawasaki (JP); Tetsuya Hasegawa, Tokorozawa (JP); Yasushi Hirose, Tokyo (JP); Junpei Kasai, Tokyo (JP); Miki Moriyama, Aichi-ken (JP)

(73) Assignees: Toyoda Gosei Co., Ltd., Nishikasugai-gun, Aichi-ken (JP); Kanagawa Academy of Science and Technology, Kawasaki-shi, Kanagawa (JP)

(*) Notice: Subject to any disclaimer, the term of this patent is extended or adjusted under 35 U.S.C. 154(b) by 837 days.

(21) Appl. No.: 11/794,910

(22) PCT Filed: Jan. 6, 2006

(86) PCT No.: PCT/JP2006/300102
§ 371 (c)(1),
(2), (4) Date: Sep. 10, 2007

(87) PCT Pub. No.: WO2006/073189
PCT Pub. Date: Jul. 13, 2006

(65) Prior Publication Data
US 2010/0035082 A1    Feb. 11, 2010

(30) Foreign Application Priority Data

Jan. 8, 2005   (JP) ................................. 2005-029722

(51) Int. Cl.
*H01L 21/70* (2006.01)
*C23C 14/08* (2006.01)
*C23C 14/28* (2006.01)
*C30B 29/16* (2006.01)
*B05D 5/12* (2006.01)

(52) U.S. Cl. ......... 428/698; 428/432; 428/426; 428/697

(58) Field of Classification Search ........................ None
See application file for complete search history.

(56) References Cited

U.S. PATENT DOCUMENTS 6,297,442 B1 * 10/2001 Yagi et al. ..................... 136/256
(Continued)

FOREIGN PATENT DOCUMENTS

CN    1753191 A    3/2006
(Continued)

OTHER PUBLICATIONS

Hansen et al. J. Vac. Sci. Techn B 23(2), Mar./Apr. 2005, p. 499-506.*
(Continued)

*Primary Examiner* — Timothy M Speer
*Assistant Examiner* — Vera Katz
(74) *Attorney, Agent, or Firm* — McGinn IP Law Group, PLLC

(57) ABSTRACT

There have been demands for transparent electrode materials and magnetic materials, each having a wide range of applications. In view of the situations, a novel functional device and a method for forming an oxide material are provided. A functional device includes an $Al_xGa_yIn_zN$ layer (wherein $0 \leq x \leq 1$, $0 \leq y \leq 1$, and $0 \leq z \leq 1$) and an oxide material layer composed of a metal oxide and formed on the $Al_xGa_yIn_zN$ layer. The metal oxide may be $TiO_2$. The present invention provides a functional device that includes a group III nitride layer having excellent physical and chemical properties and a film integrally formed thereon. The film reflects less light at the interface and has chemical resistance and high durability.

8 Claims, 20 Drawing Sheets

U.S. PATENT DOCUMENTS

| | | | |
|---|---|---|---|
| 7,095,089 B2* | 8/2006 | Yagi et al. | 257/433 |
| 2001/0045561 A1 | 11/2001 | Hata et al. | |
| 2003/0035636 A1* | 2/2003 | Hansen et al. | 385/114 |
| 2004/0094801 A1* | 5/2004 | Liang et al. | 257/347 |
| 2004/0131537 A1* | 7/2004 | Yang et al. | 423/592.1 |
| 2004/0200976 A1* | 10/2004 | Yagi et al. | 250/372 |
| 2007/0065359 A1* | 3/2007 | Sengupta et al. | 424/1.11 |
| 2007/0287025 A1* | 12/2007 | Furubayashi et al. | 428/640 |
| 2009/0110633 A1* | 4/2009 | Sengupta et al. | 424/1.29 |

FOREIGN PATENT DOCUMENTS

| | | | |
|---|---|---|---|
| JP | 4-2167 | | 1/1992 |
| JP | 11092176 | * | 4/1999 |
| JP | 2001-308383 | * | 11/2001 |
| JP | 2003-78168 | | 3/2003 |
| JP | 2004-95240 | | 3/2004 |
| JP | 2004-361815 | | 12/2004 |

OTHER PUBLICATIONS

Bei et al. J. Mat. Res., vol. 19, No. 11, Nov. 2004, p. 3189-3196.*

Hitosugi et al. J. J of Appl. Physics, 44, No. 50, 2005 p. L1503-L1505.*

Chambers et al. Applied Physics Letters, 79, No. 21 2001, 3467-3469.*

Furubayashi et al. Applied Physics Letters 86, 2005 1-3.*

Matsumoto et al. Science 291, 2001 p. 854-856.*

Korean Office Action dated Feb. 17, 2009, with partial English translation.

Yamamoto, et al., "Homo-epitaxial growth of rutile $TiO_2$ film on step and terrace structure substrate", Applied Surface Science 238 (2004) 189-192.

Saila Karvinen, "The effects of trace elements on the crystal properties of $TiO_2$, ", Solid State Sciences 5 (2003) 811-819.

Liu, et al., "Structural characterization of $TiO_2$ thin films prepared by pulsed laser deposition on GaAs (100) substrates", Applied gurface Science 174 (2001) 35-39.

Yuji Matsumoto, et al., "Combinatorial thin film technology and the discovery of room-temperature transparent magnetic oxide", Oyo Butsuri vol. 73, No. 5 p. 0587-p. 0592(2004).

He, et al., "Four-thin film transistor pixel electrode circuits for active-matrix organic light-emitting displays", Jpn. J. Appl. Phys. vol. 40 (2001)pp. L 1204-L 1206 Part 1, No. 3A, Mar. 2001.

Hidemi Toyosaki, et al., Anomalous Hall effect governed by electron doping in a room-temperature transparent ferromagnetic semiconductor, Nature Materials, vol. 3, pp. 221-224, Apr. 2004, www.nature.com/naturematerials.

Murakami, et al., "Anatase TiO2 thin films grown on lattice-matched LaAIO3 substrate by laser molecular-beam epitaxy", Applied Physics Letters vol. 78, No. 18, pp. 2664-2666, Apr. 30, 2001.

Chinese Office Action dated Aug. 15, 2008 with Japanese-Language Translation and Partial English-Language Translation.

Korean Office Action dated Sep. 9, 2009 and partial English translation thereof.

Nakamura, Shuji, et al.,"The Blue Laser Diode, The Complete Story", Springer, 2nd Revised and Enlarged Edition, pp. 28-33 Oct. 2000.

Titanium Oxide, Manabu Kiyono, Gihodo Shuppan, pp. 52-53.

Shinkosha Web Site, Oct. 6, 2007.

* cited by examiner

[Fig. 1]
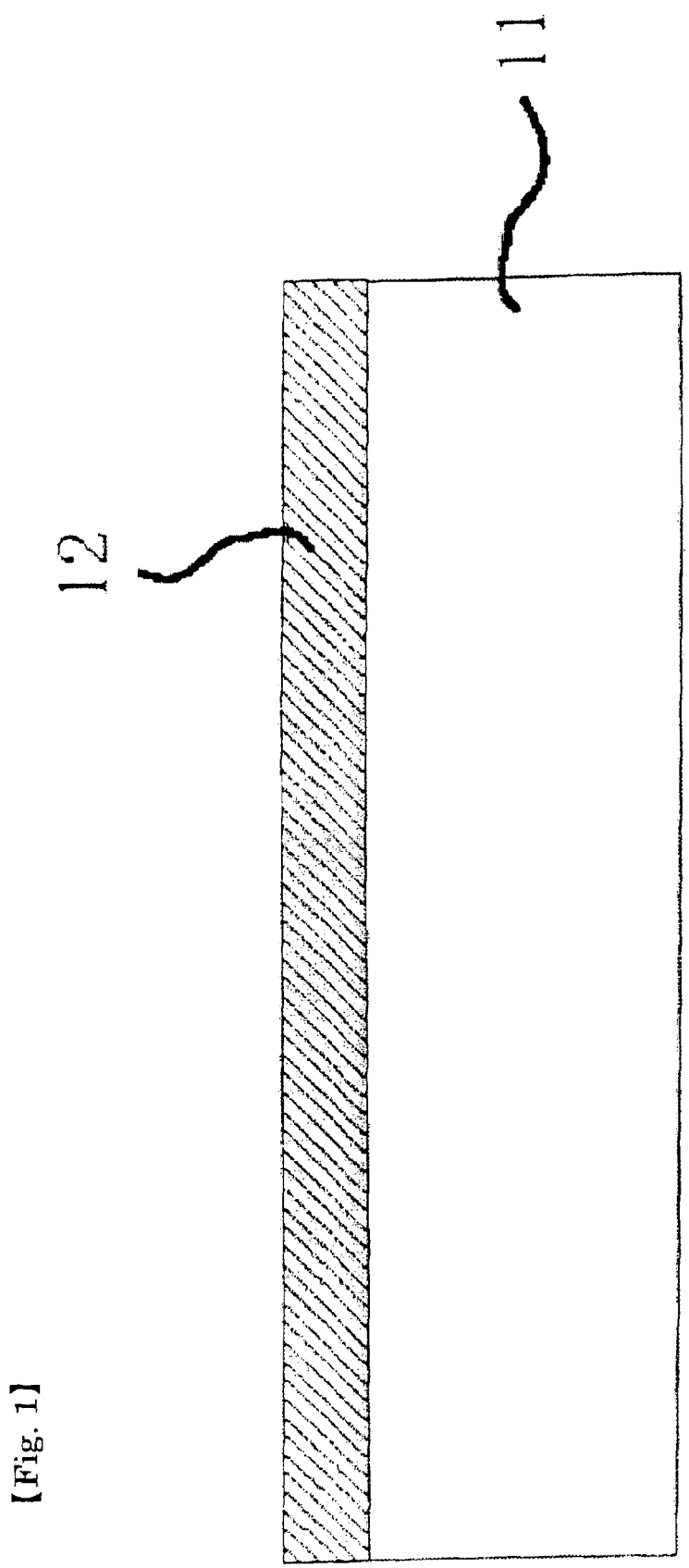

[Fig. 2]
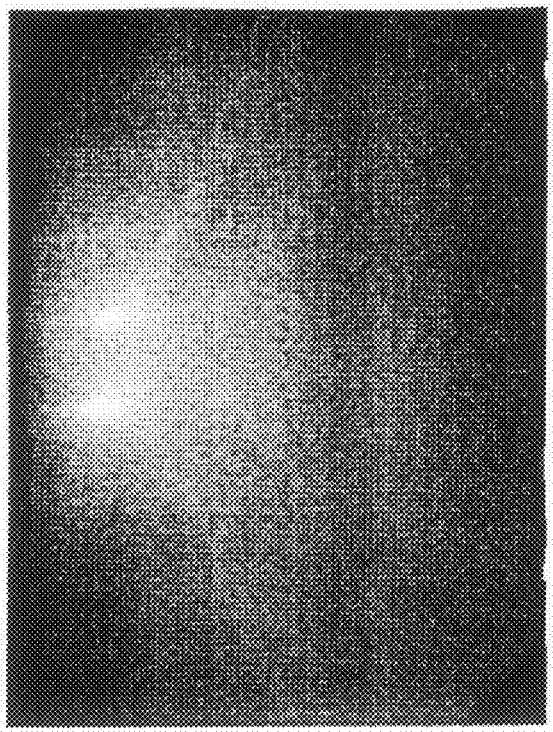
RHEED PATTERN AFTER TREATMENT
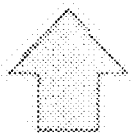
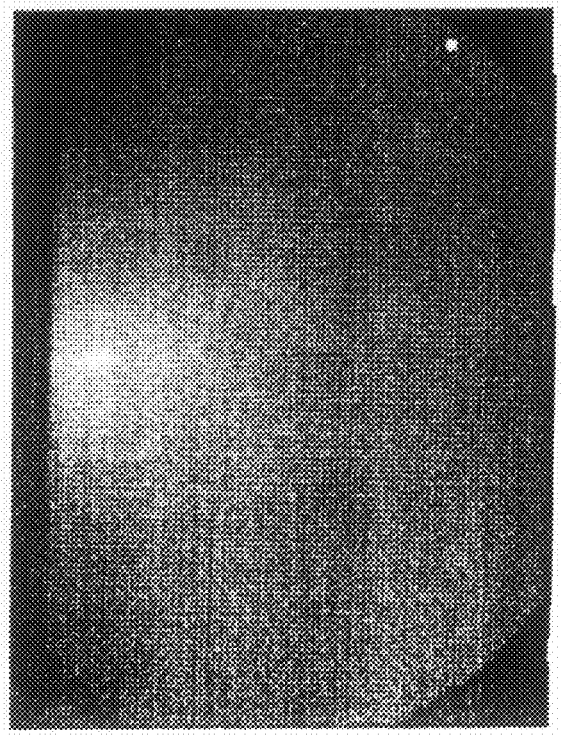
RHEED PATTERN BEFORE TREATMENT

[Fig. 3]
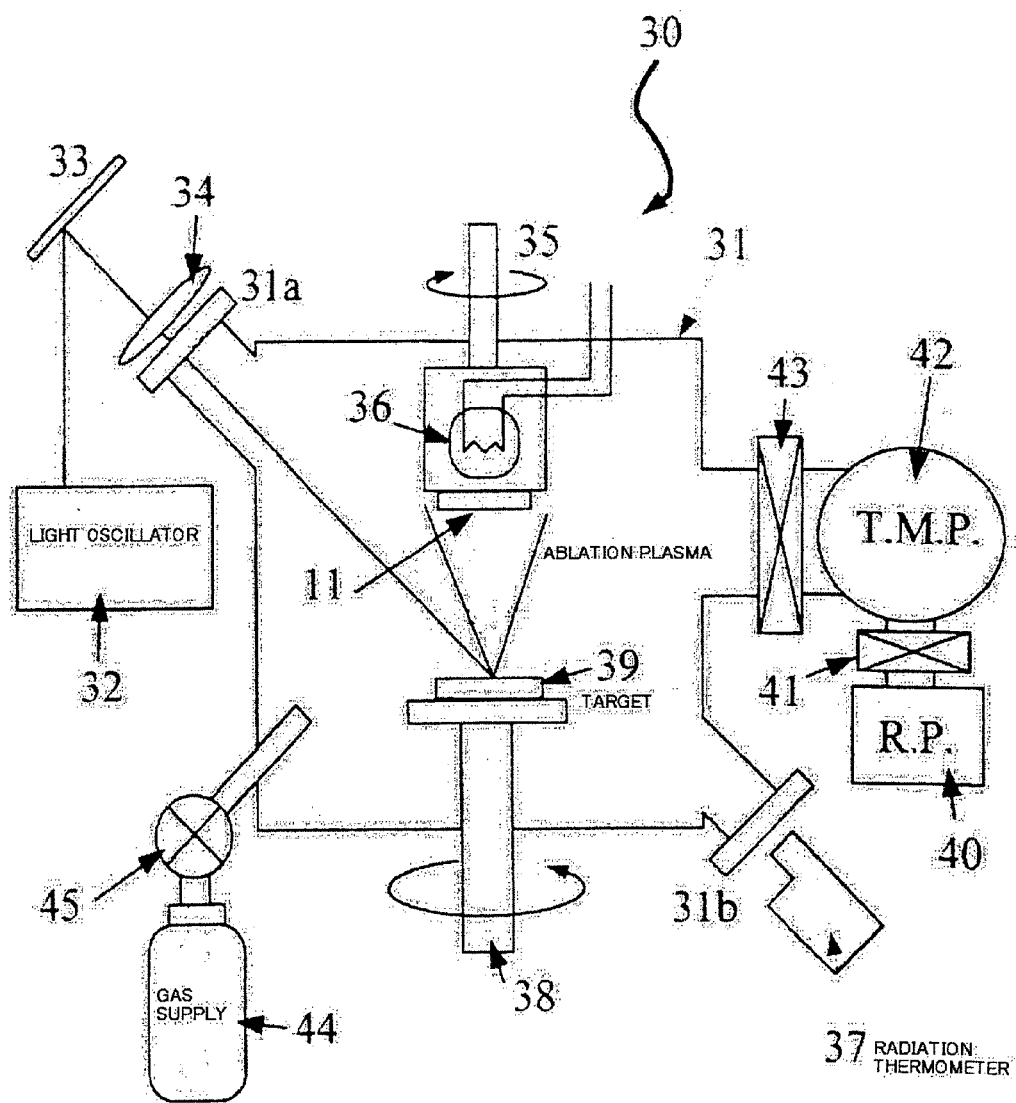

[Fig. 4]
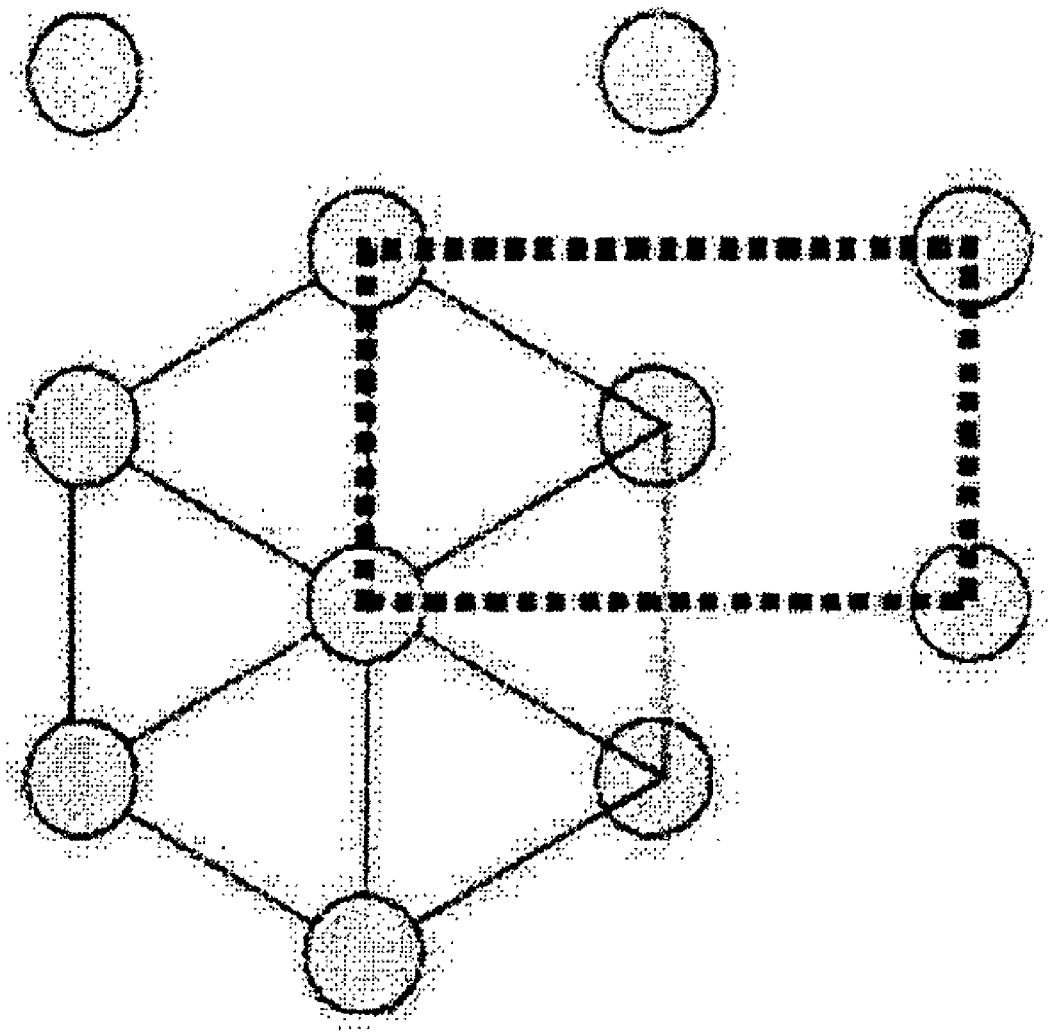
GaN(0001) PLANE

[Fig. 5 A]
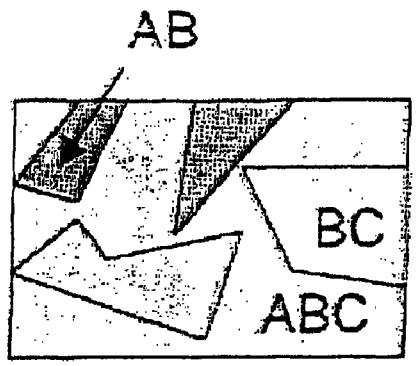
[Fig. 5 B]
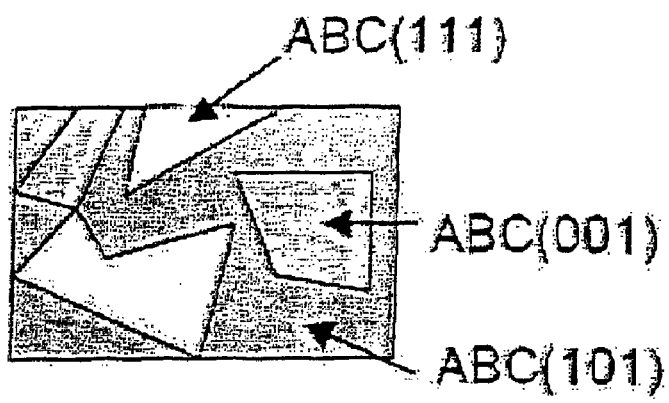
[Fig. 5 C]
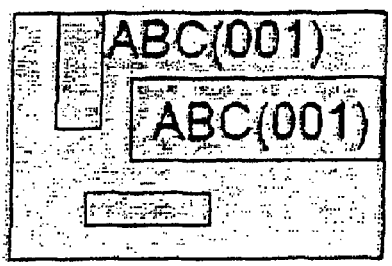
[Fig. 5 D]
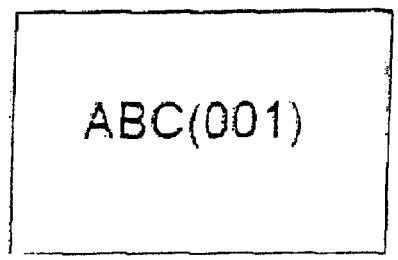

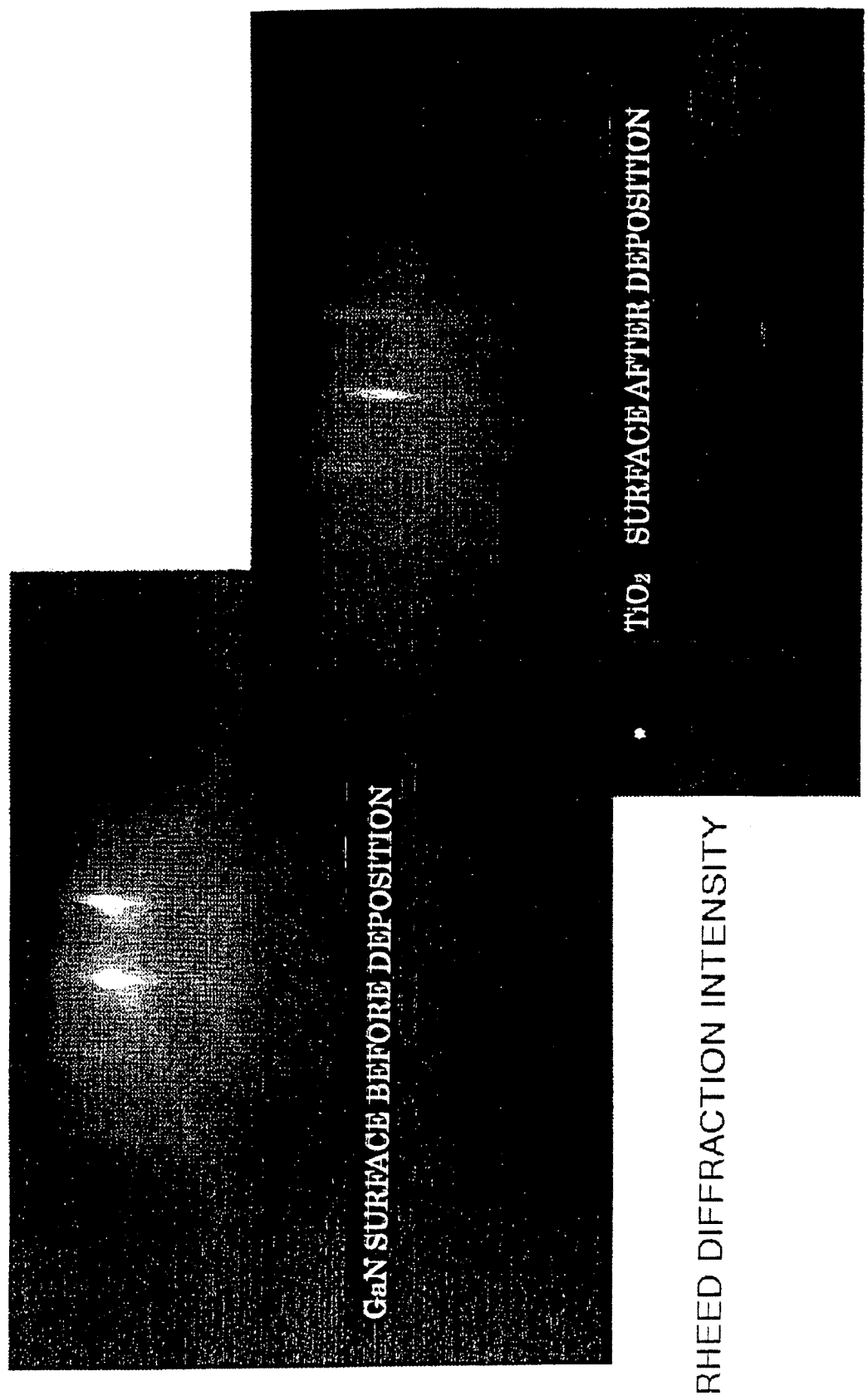
[Fig. 6]

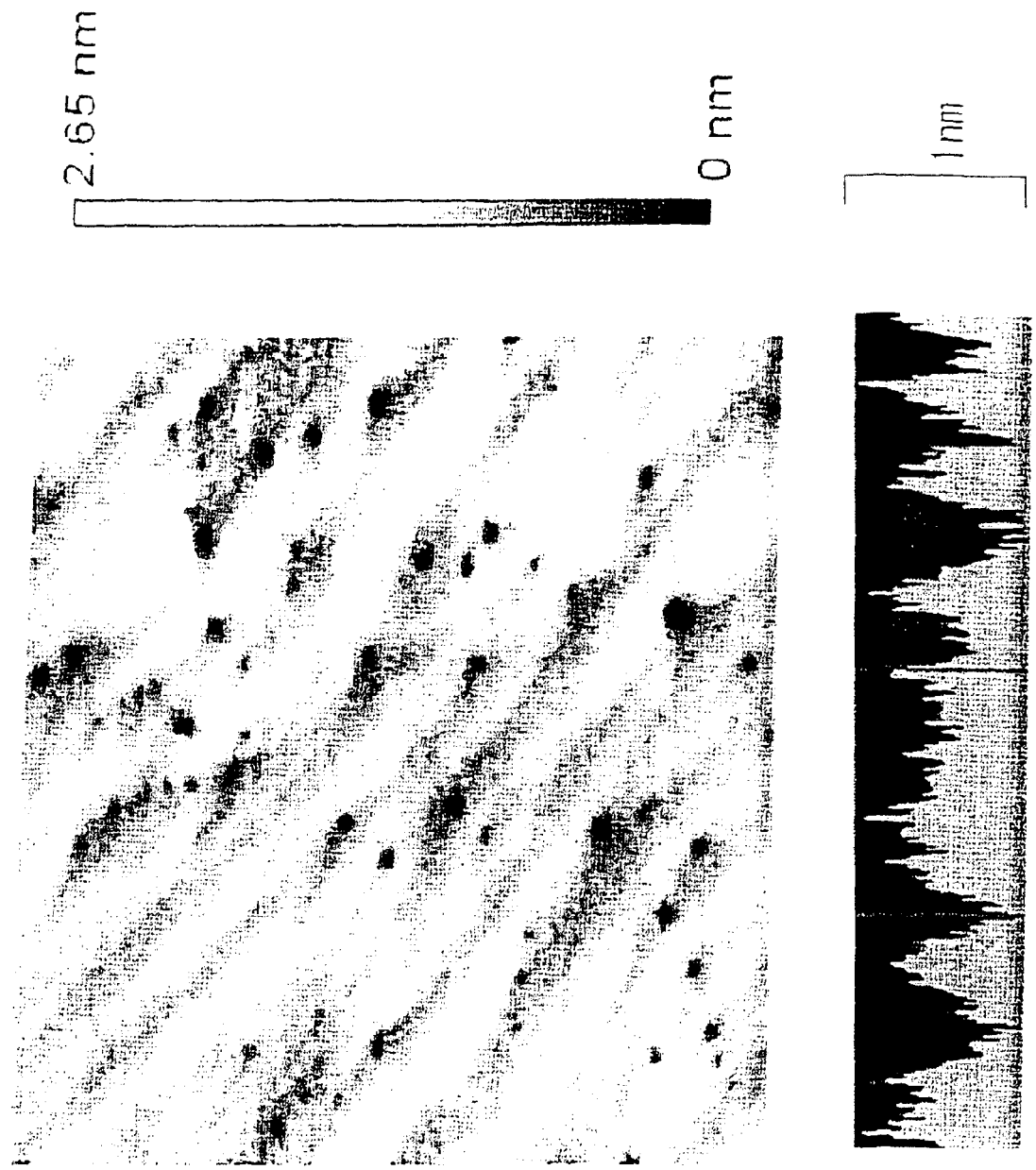
[Fig. 8]

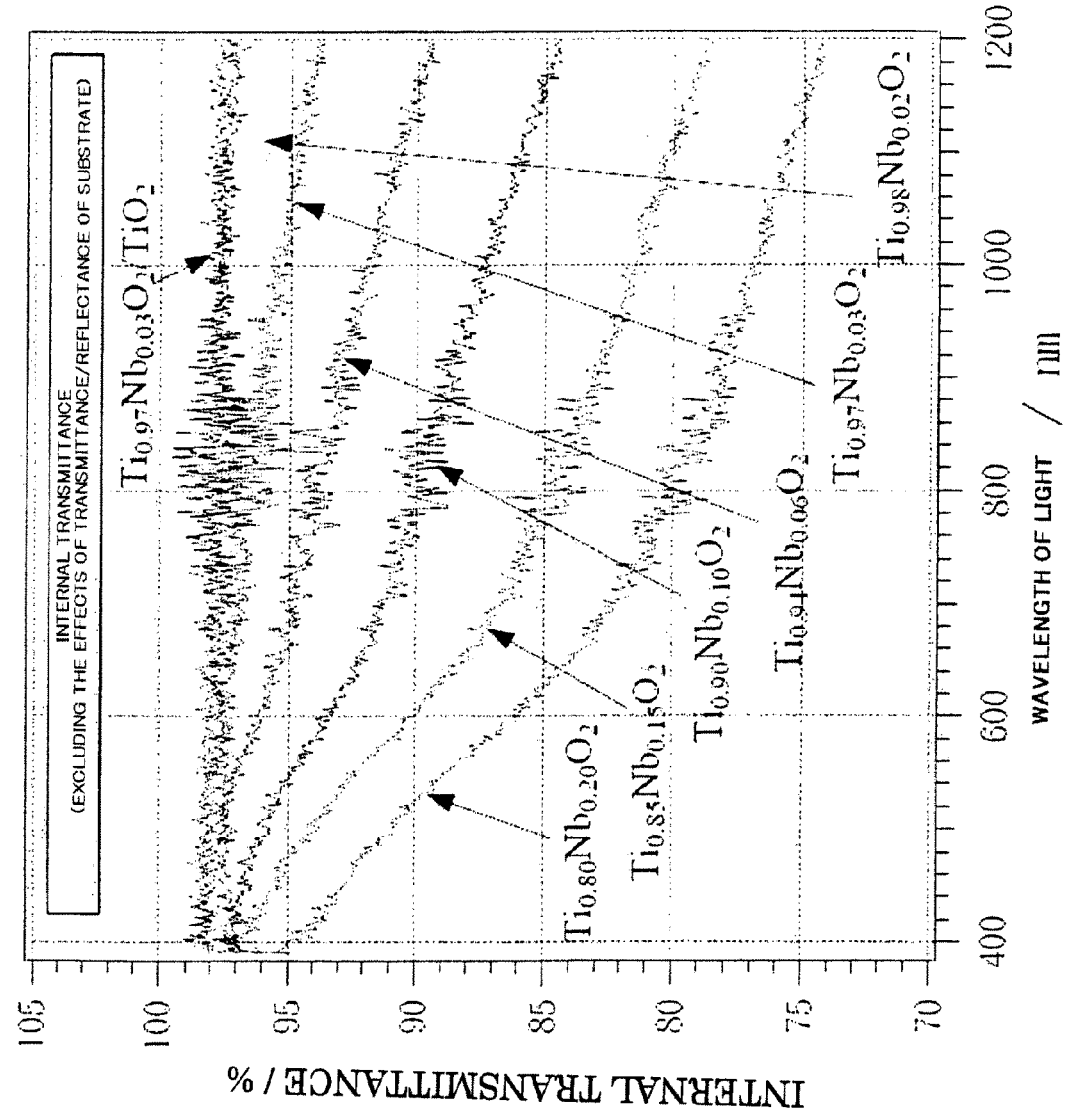
[Fig. 9]

[Fig. 10]
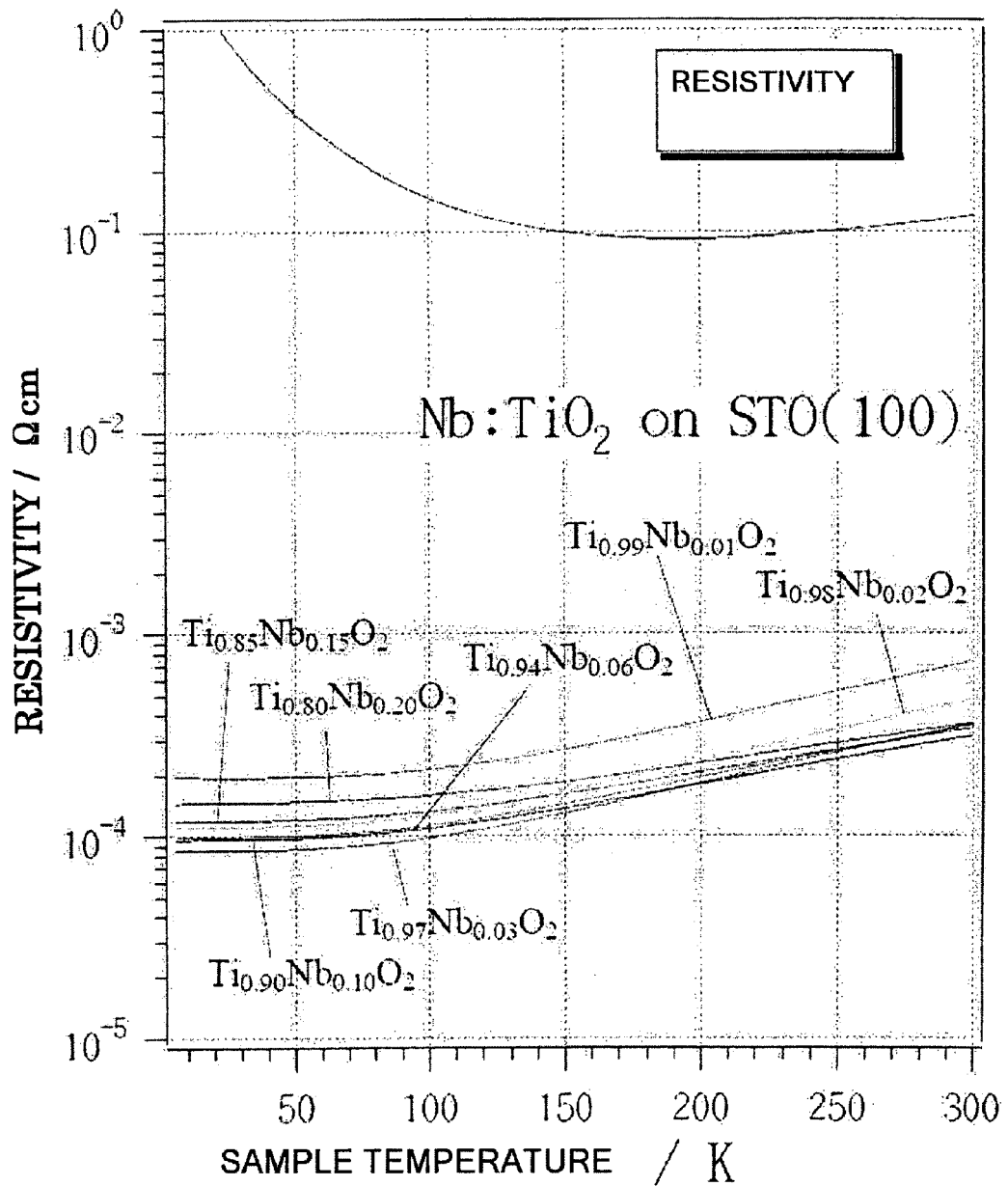

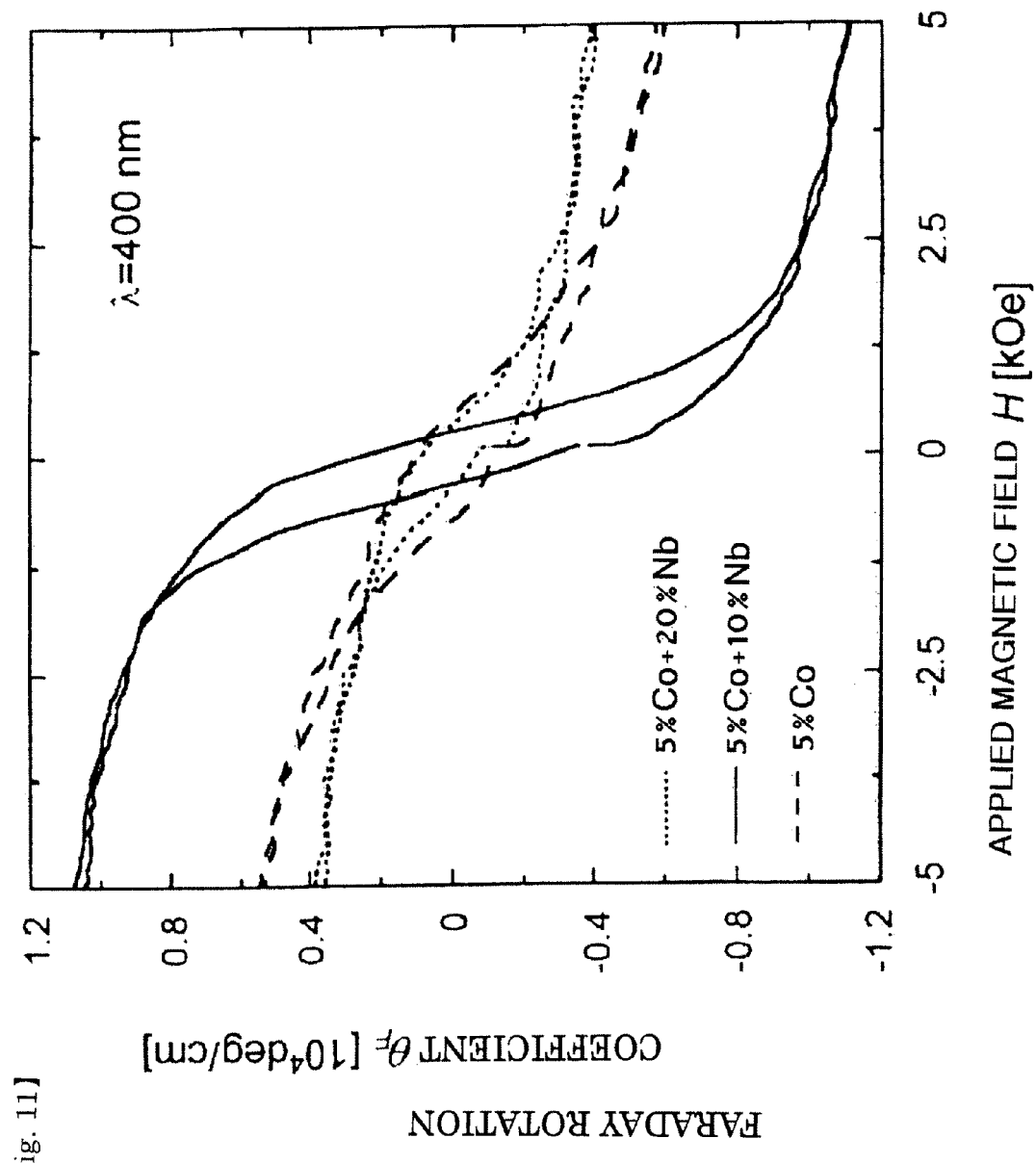
[Fig. 11]

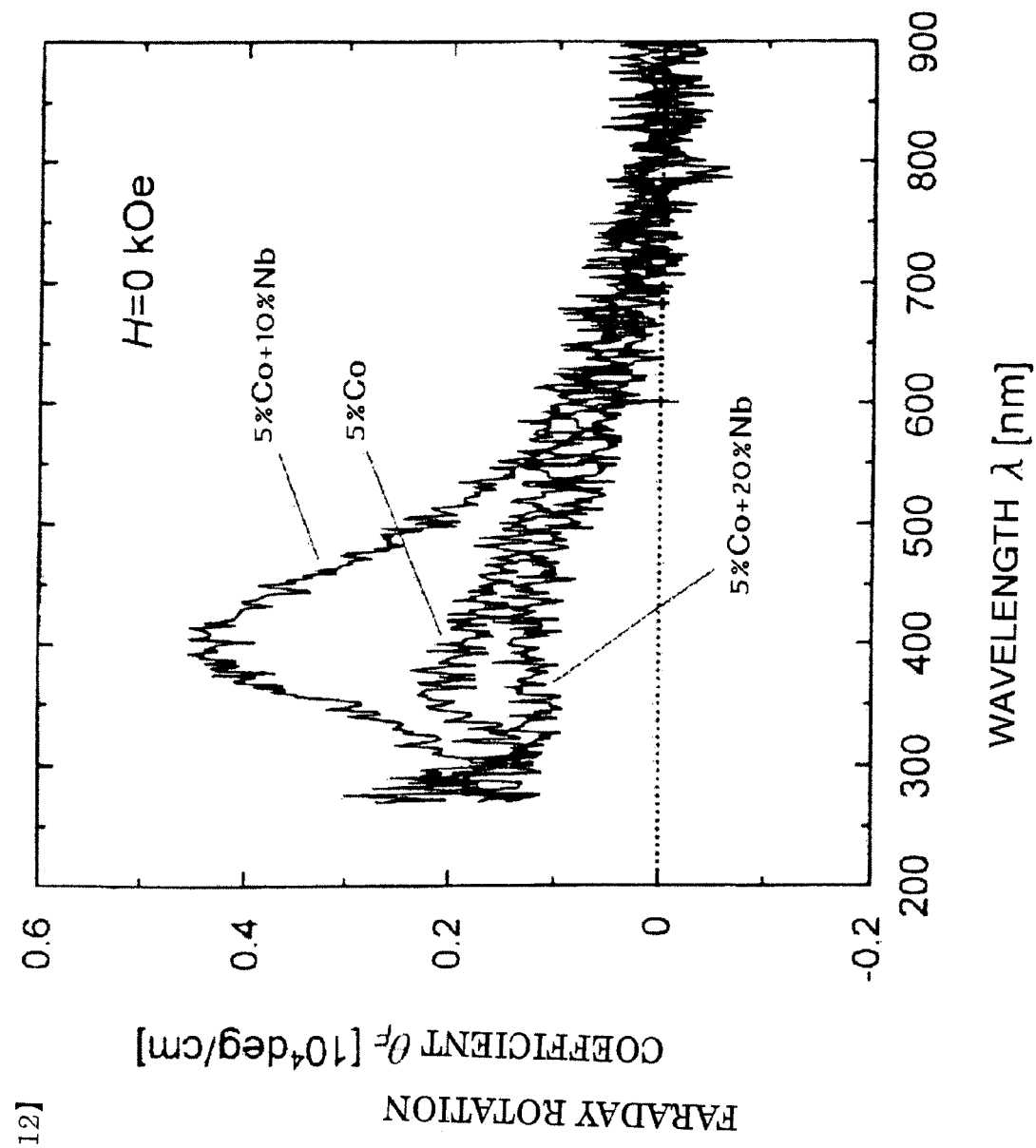
[Fig. 12]

[Fig. 13]
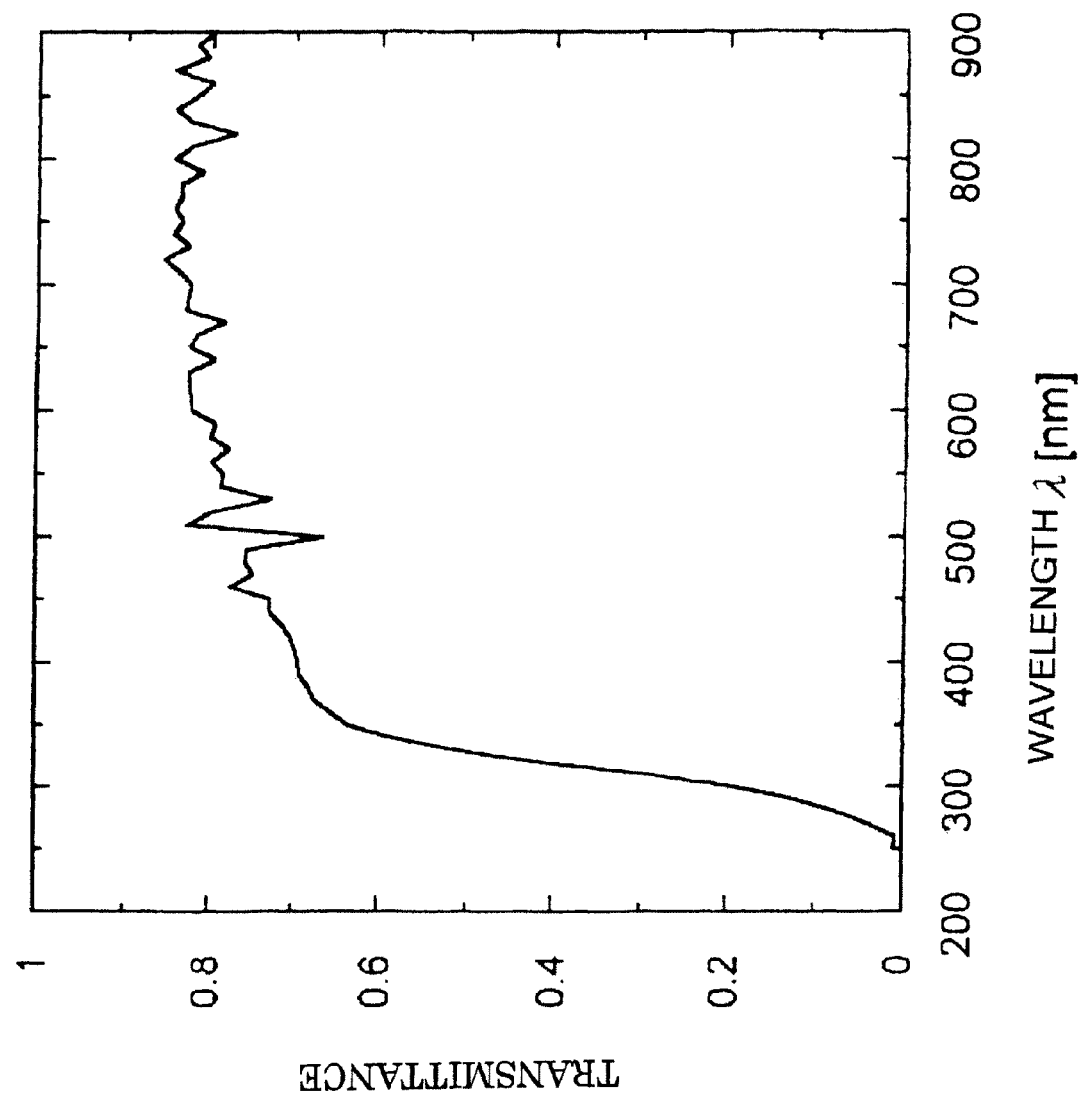

[Fig. 14 A]
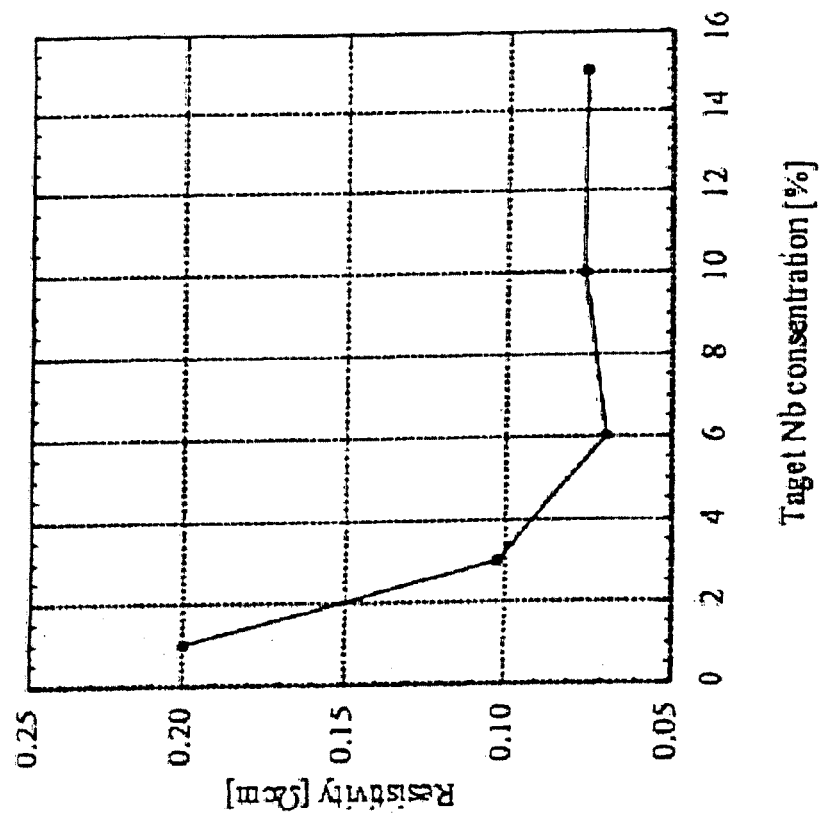
[Fig. 14 B]
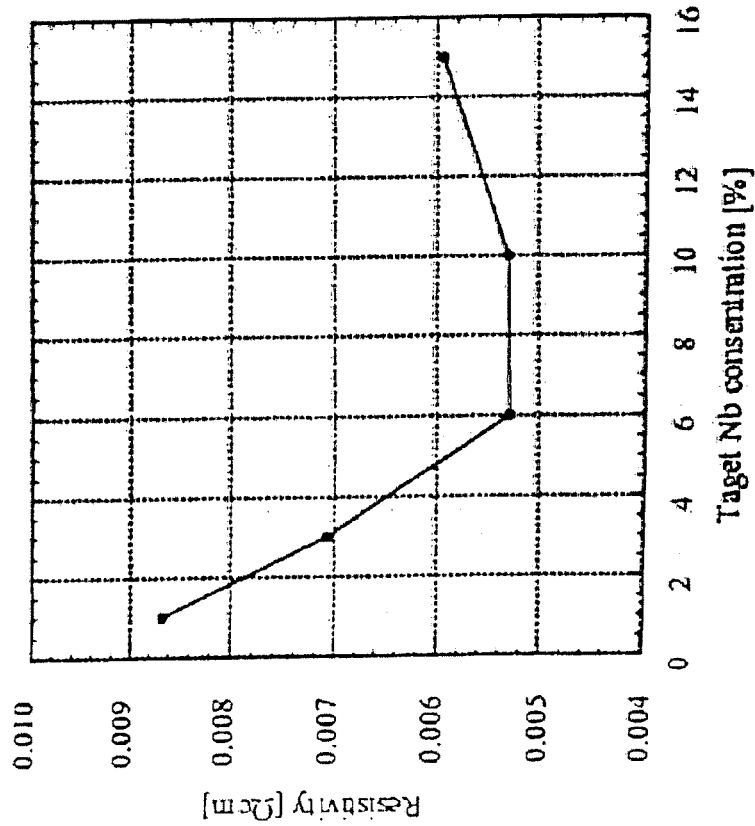

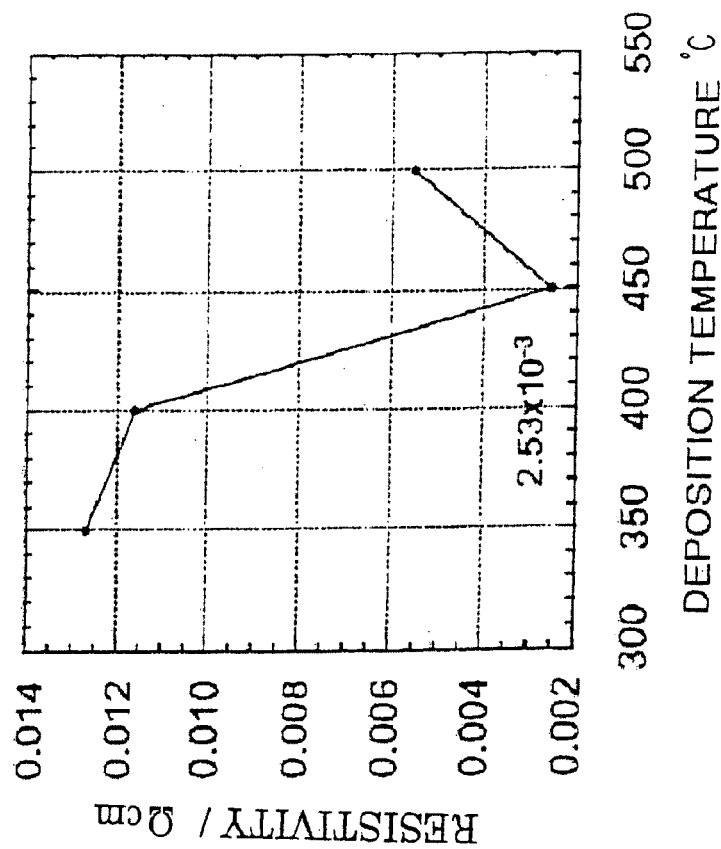
[Fig. 15 A]
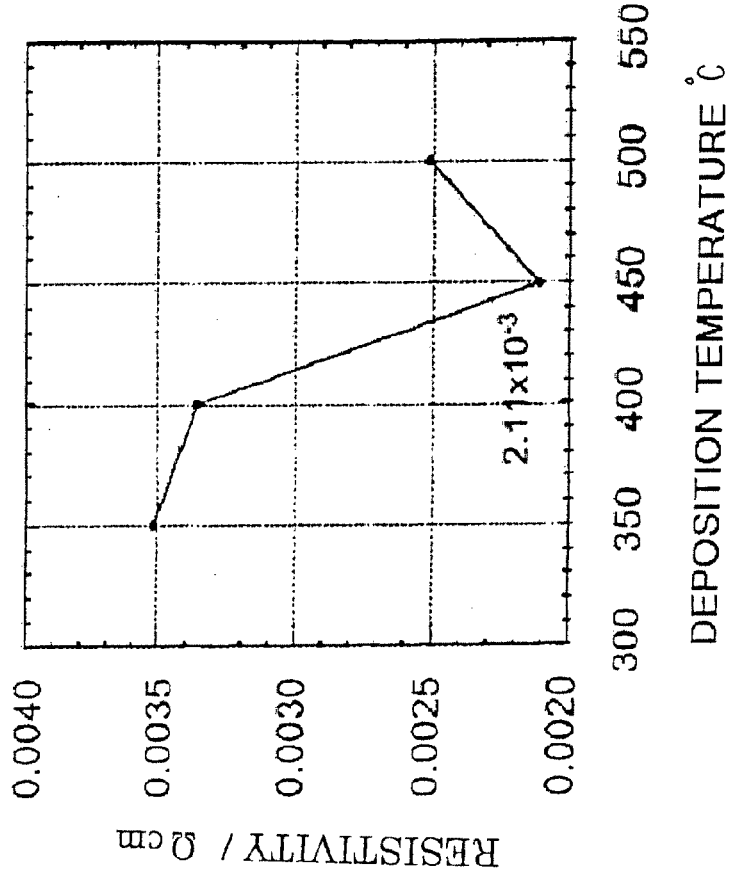
[Fig. 15 B]

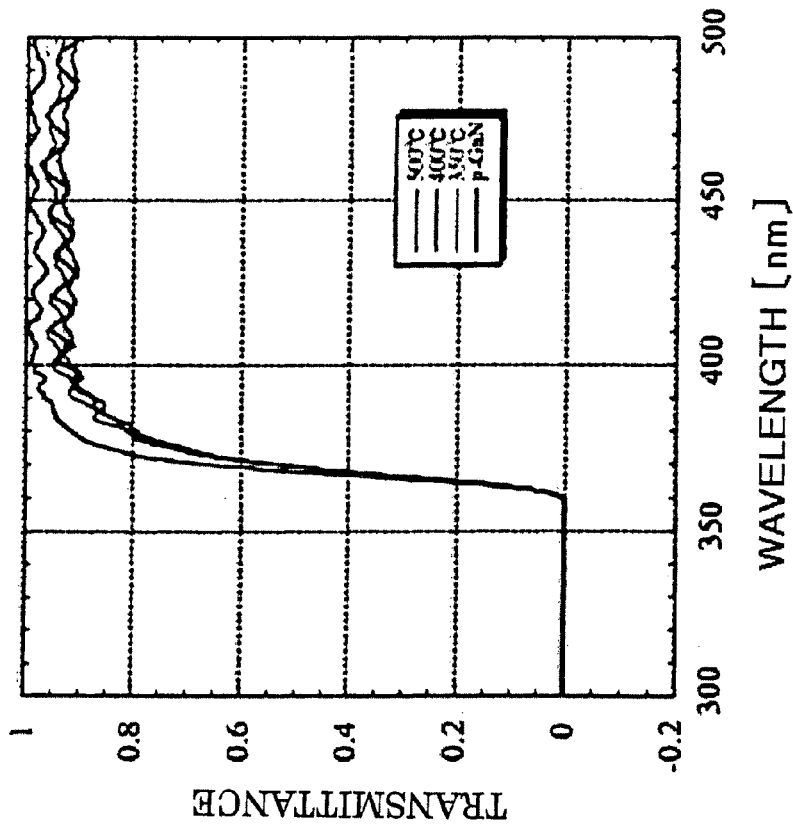
[Fig. 16 A]
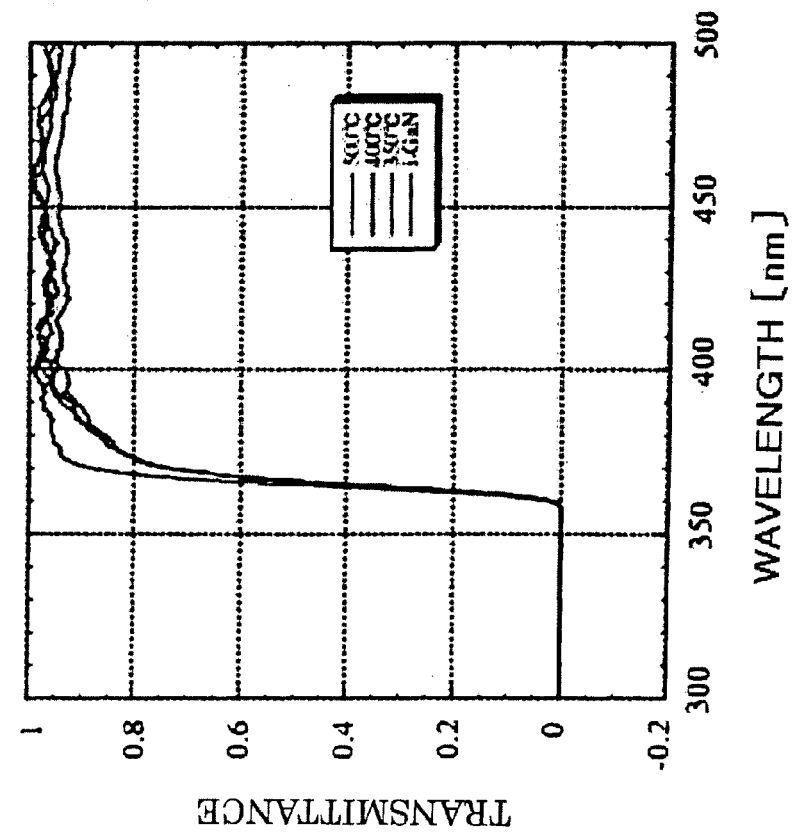
[Fig. 16 B]

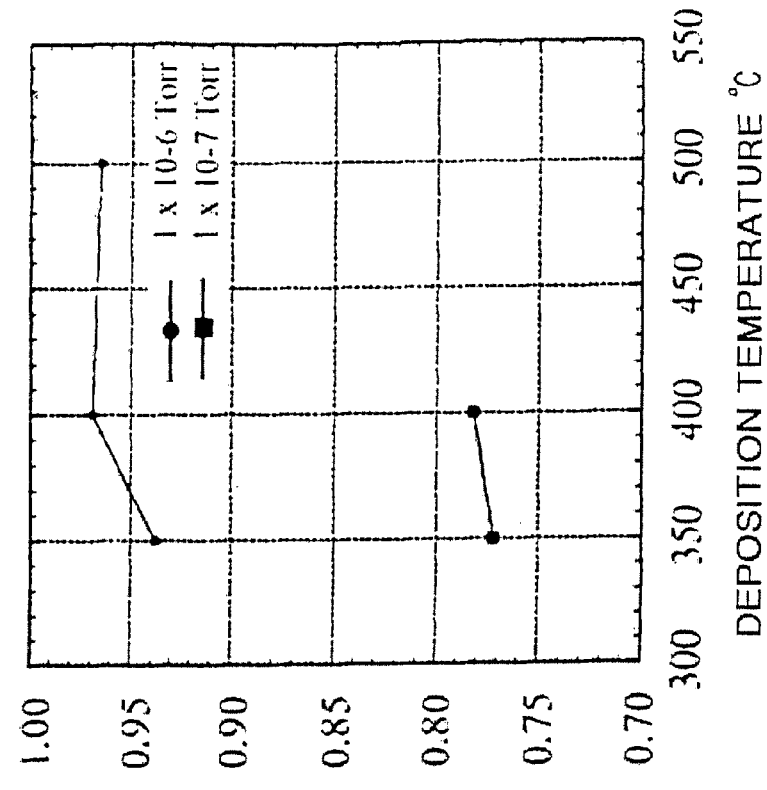
[Fig. 17 A]
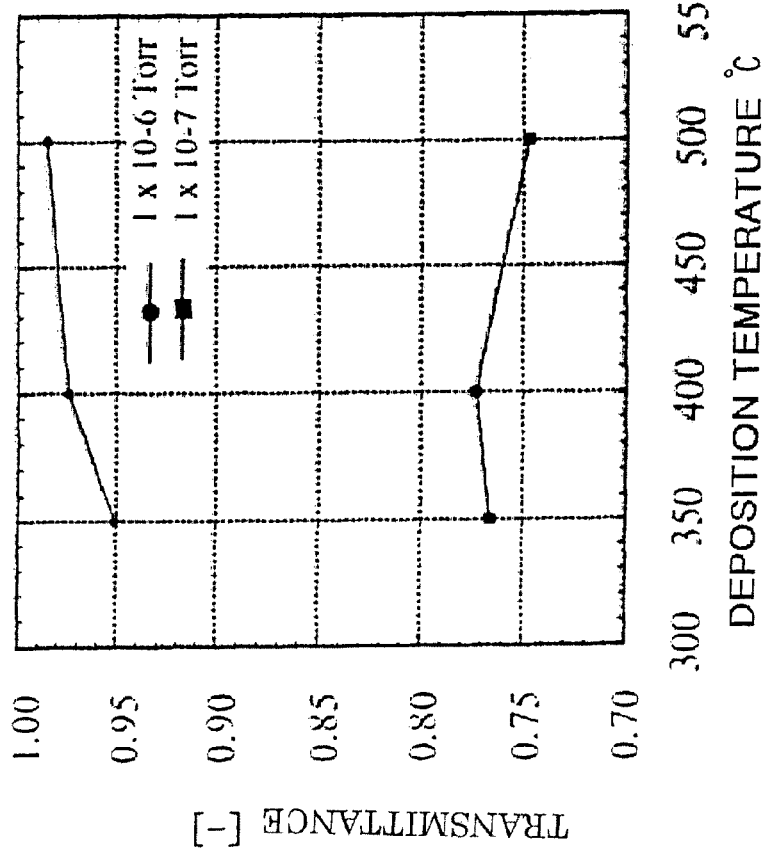
[Fig. 17 B]

[Fig. 18 A]
SCHEMATIC VIEW OF SUBSTRATE
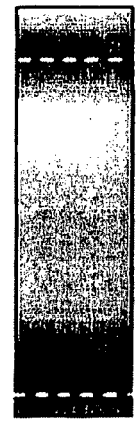
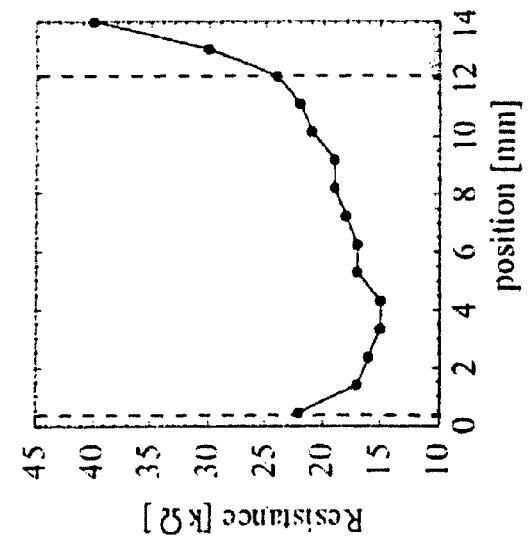
[Fig. 18 B]
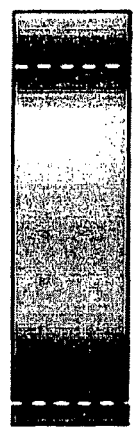
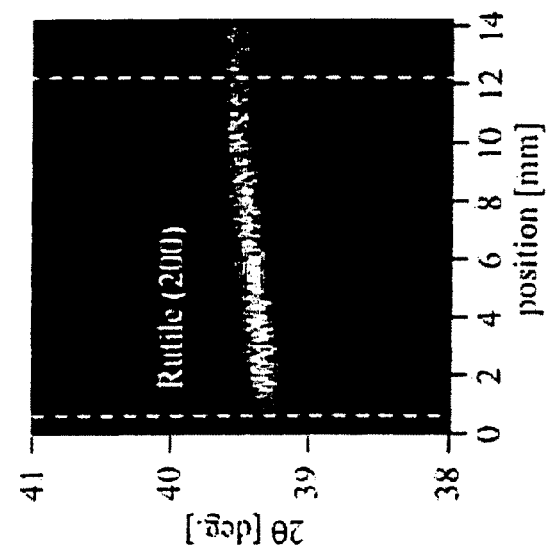
[Fig. 18 C]
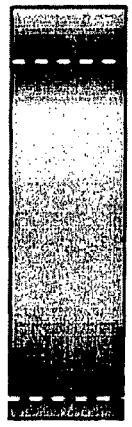
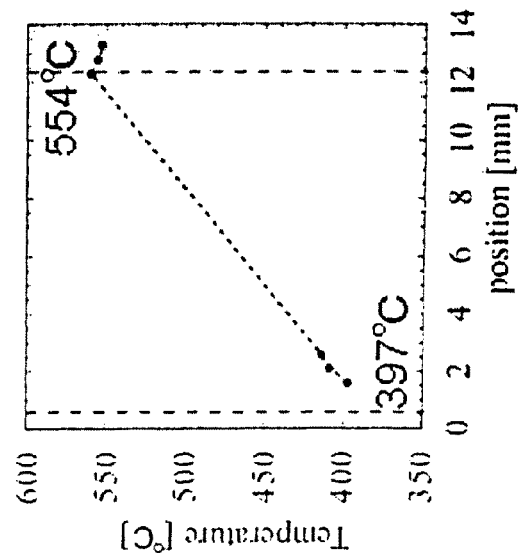

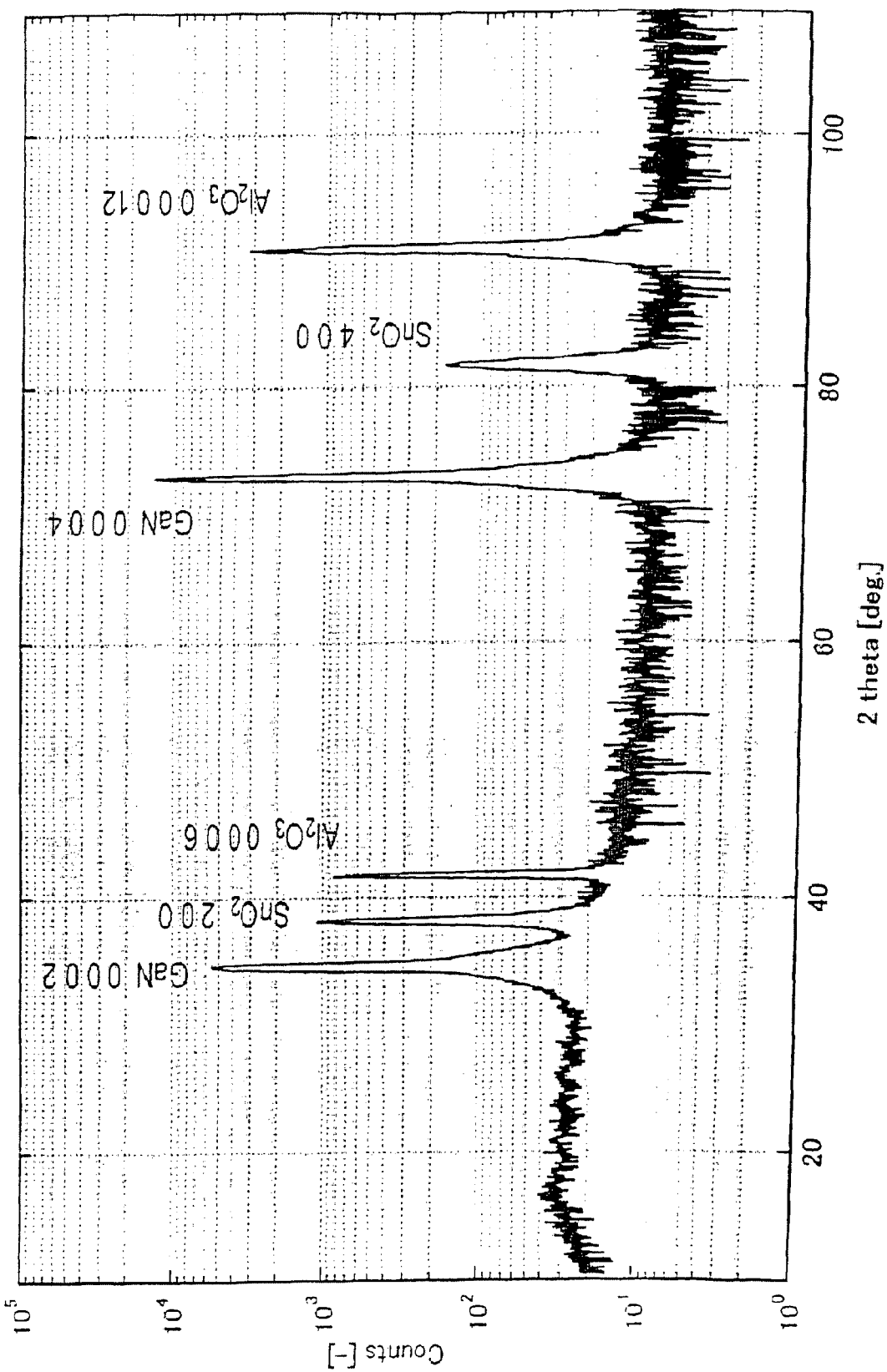
[Fig. 19]

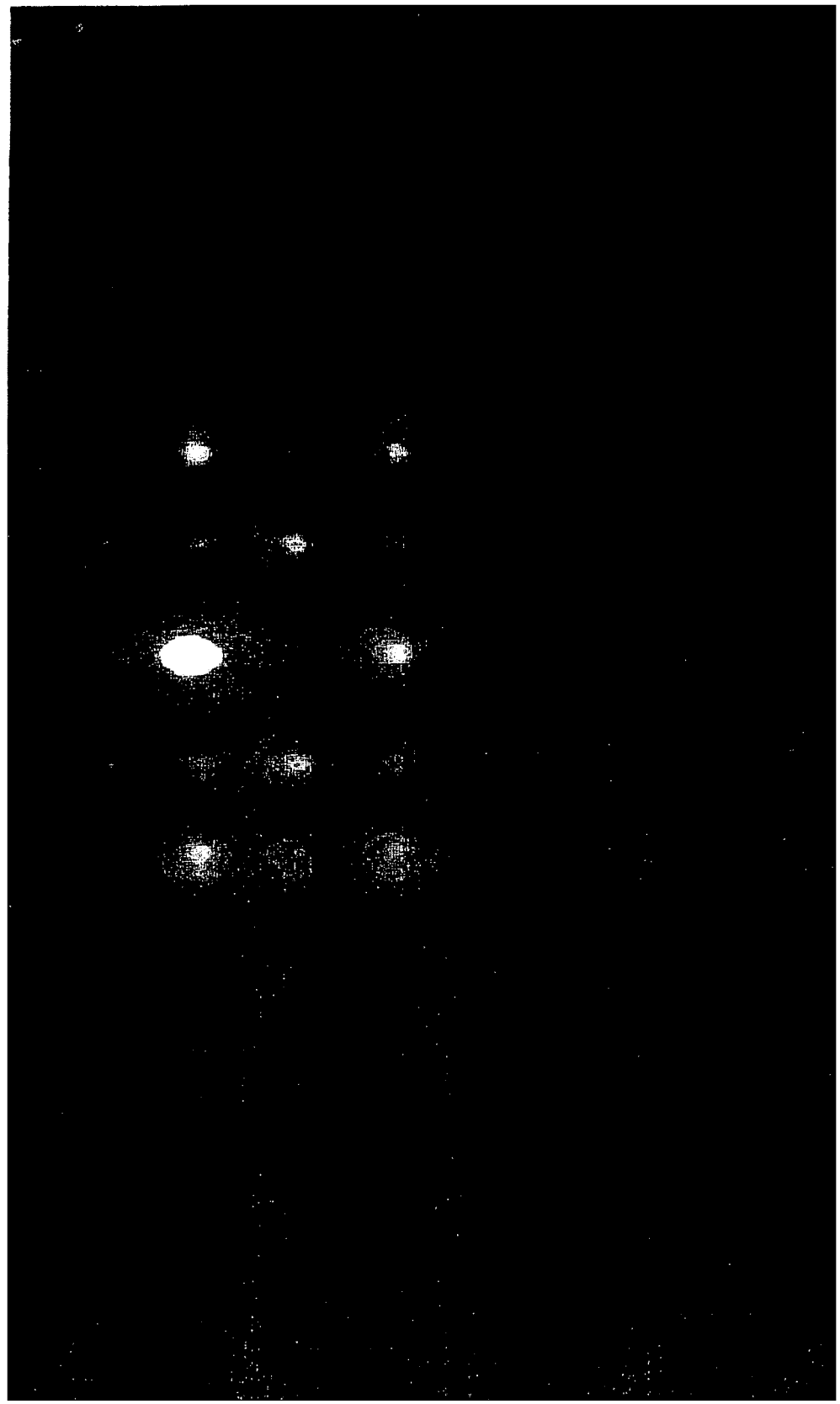
[Fig. 20]

INTERNAL GEAR PUMP

TECHNICAL FIELD

The present invention relates to an oxide material.

BACKGROUND ART

In recent years, there has been a growing demand for larger display panels and smaller portable display panels. To this end, the power consumption of display elements must be reduced. In addition, transparent electrodes having high visible light transmittance and low resistance must be used.

Thus, an indium-tin-oxide film (hereinafter referred to as ITO film) in which an indium oxide is doped with several percent of tin is formed on a transparent substrate such as a glass plate to further decrease the resistance of a transparent electroconductive thin film (see, for example, Patent Document 1).

While the ITO film is highly transparent and has high electrical conductivity, the crustal abundance of indium is as small as 50 ppb. The cost of indium may therefore increase with the depletion of resources.

Furthermore, particularly in recent years, zinc oxide materials have been proposed as inexpensive materials having high plasma resistance.

However, zinc oxide materials are sensitive to acid or alkaline and erode gradually even in a carbon dioxide atmosphere. Although zinc oxide materials may be coated to improve their chemical resistance, the additional coating process causes an increase in manufacturing costs.

Hence, the transparent conductors must be composed of stably supplied materials having chemical resistance and high durability to extend the application range of the transparent conductors.

Under these circumstances, titanium dioxide ($TiO_2$), which has both chemical resistance and high durability, has received attention (see, for example, Non-patent Document 1). For example, a $TiO_2$ film is epitaxially grown on a sapphire substrate (see, for example, Non-patent Documents 2, 3, and 4).

However, when a sapphire substrate is used, a function of combining a substrate material and a different thin-film material (heterojunction) cannot be utilized. Thus, the sapphire substrate can negligibly function beyond being a simple structural material.

Patent Document 1: Japanese Unexamined Patent Application Publication No. 2004-95240
Non-patent Document 1: OYO BUTURI, 73, 5, 587-592 (2004)
Non-patent Document 2: Jpn. J. Appl. Phys. Vol. 40, pp. L 1204-L 1206 (2001)
Non-patent Document 3: Nature Materials 3, 221-224 (2004)
Non-patent Document 4: APPLIED PHYSICS LETTERS, VOLUME 78, NUMBER 18, 2664-2666 (2001)

DISCLOSURE OF INVENTION

Problems to be Solved by the Invention

The present invention was achieved in view of the situations described above. It is an object of the present invention to provide a functional device having novel characteristics and a method for forming an oxide material.

Means for Solving the Problems

The present invention includes functional devices and methods described in the appended claims to achieve the object described above. The present invention will be described in detail below.

A first aspect of the present invention is a functional device that includes an $Al_xGa_yIn_zN$ layer (wherein $0 \leq x \leq 1$, $0 \leq y \leq 1$, and $0 \leq z \leq 1$) and an oxide material layer formed on the $Al_xGa_yIn_zN$ layer. The oxide material layer is composed of a metal oxide that is $TiO_2$.

According to the first aspect of the present invention, the functional device includes a group III nitride layer having excellent physical and chemical properties and a $TiO_2$ film integrally formed on the group III nitride layer. The $TiO_2$ film reflects less light at the interface and has chemical resistance and high durability.

A second aspect of the present invention is a method for forming an oxide material layer composed of a metal oxide on an $Al_xGa_yIn_zN$ layer (wherein $0 \leq x \leq 1$, $0 \leq y \leq 1$, and $0 \leq z \leq 1$) by a pulsed laser deposition method. The metal oxide is $TiO_2$.

According to the second aspect, a high-quality $TiO_2$ epitaxial film having reduced contact resistance and less scattering at the interface can be formed on a group III nitride layer having excellent physical and chemical properties.

A third aspect of the present invention is a functional device that includes an $Al_xGa_yIn_zN$ layer (wherein $0 \leq x \leq 1$, $0 \leq y \leq 1$, and $0 \leq z \leq 1$) and an oxide material layer formed on the $Al_xGa_yIn_zN$ layer. The oxide material is composed of a metal oxide that is $SnO_2$.

According to the third aspect of the present invention, the functional device includes a group III nitride layer having excellent physical and chemical properties and a $SnO_2$ film integrally formed on the group III nitride layer. The $SnO_2$ film reflects less light at the interface and has chemical resistance and high durability.

A fourth aspect of the present invention is a method for forming an oxide material layer composed of a metal oxide on an $Al_xGa_yIn_zN$ layer ($0 \leq x \leq 1$, $0 \leq y \leq 1$, and $0 \leq z \leq 1$) by a pulsed laser deposition method. The metal oxide is $SnO_2$.

According to the fourth aspect, a high-quality $SnO_2$ epitaxial film having reduced contact resistance and less scattering at the interface can be formed on a group III nitride layer having excellent physical and chemical properties.

$Al_xGa_yIn_zN$ (wherein $0 \leq x \leq 1$, $0 \leq y \leq 1$, and $0 \leq z \leq 1$) used in the present specification and the appended claims encompasses $Al_xGa_yIn_zN$ where $x+y+z=1$, $Al_xGa_yIn_zN$ containing no dopant, $Al_xGa_yIn_zN$ doped with a transition metal, Si, Mg, or Zn, p-type semiconductors, and n-type semiconductors.

ADVANTAGES OF THE INVENTION

The present invention provides a functional device that includes a group III nitride layer having excellent physical and chemical properties and a film integrally formed thereon. The film reflects less light at the interface and has chemical resistance and high durability.

Further objects, features, or advantages of the present invention will become apparent from the following detailed description of the embodiments with reference to the attached drawings.

BRIEF DESCRIPTION OF THE DRAWINGS

FIG. 1 is a schematic view of an oxide material film formed on a substrate.
FIG. 2 illustrates RHEED patterns of a substrate before and after pretreatment.

FIG. 3 is a schematic view of a structure of a pulsed laser deposition (PLD) apparatus.

FIG. 4 is a schematic view of a crystal structure of GaN (wurtzite-type $Al_xGa_yIn_zN$).

FIG. 5 shows schematic views of four crystal quality levels ((A) level 1: a multiphase polycrystalline film, (B) level 2: a single-phase polycrystalline film, (C) level 3: a single-phase oriented epitaxial film, and (D) Level 4: a single crystal epitaxial film).

FIG. 6 is an electron diffraction image (RHEED pattern) of the surface of a $TiO_2$ film formed by a physical vapor deposition (PVD) method on a GaN substrate treated with hydrochloric acid and an electron diffraction image (RHEED pattern) of the surface of the GaN substrate before deposition.

FIG. 8 is an atomic force microscope (AFM) image of the surface of a $TiO_2$ film formed by a PVD method on a GaN substrate treated with hydrochloric acid.

FIG. 9 is a graph of the internal transmittances of metal oxide layers.

FIG. 10 is a graph illustrating the temperature dependence of resistivity of metal oxide layers.

FIG. 11 is a graph illustrating the dependence of the Faraday rotation coefficient of $Ti_{1-x-y}Co_xNb_yO_2$ on applied magnetic field at room temperature.

FIG. 12 is a graph illustrating the wavelength dependence of the Faraday rotation coefficient of $Ti_{1-x-y}Co_xNb_yO_2$ at room temperature.

FIG. 13 is a graph of the external transmittance of a $TiO_2$ thin film containing 5% Co and 10% Nb at room temperature.

FIG. 14 shows graphs illustrating the composition dependence of resistivity of $TiO_2$ films doped with different amounts of niobium.

FIG. 15 shows graphs illustrating the dependence of resistivity of a $TiO_2$ film doped with 6% Nb on substrate temperature in deposition.

FIG. 16 shows graphs illustrating the wavelength dependence of transmittance of a $TiO_2$ film doped with 6% Nb.

FIG. 17 shows graphs illustrating the dependence of transmittance of a $TiO_2$ film doped with 6% Nb on substrate temperature and oxygen partial pressure.

FIG. 18 shows graphs of various measurements with a deposition temperature graded film.

FIG. 19 is a graph of X-ray diffraction (XRD) of a $SnO_2$ film formed by a PLD method.

FIG. 20 is an electron diffraction image (RHEED pattern) of a $SnO_2$ film formed by a PLD method.

Figure 7:
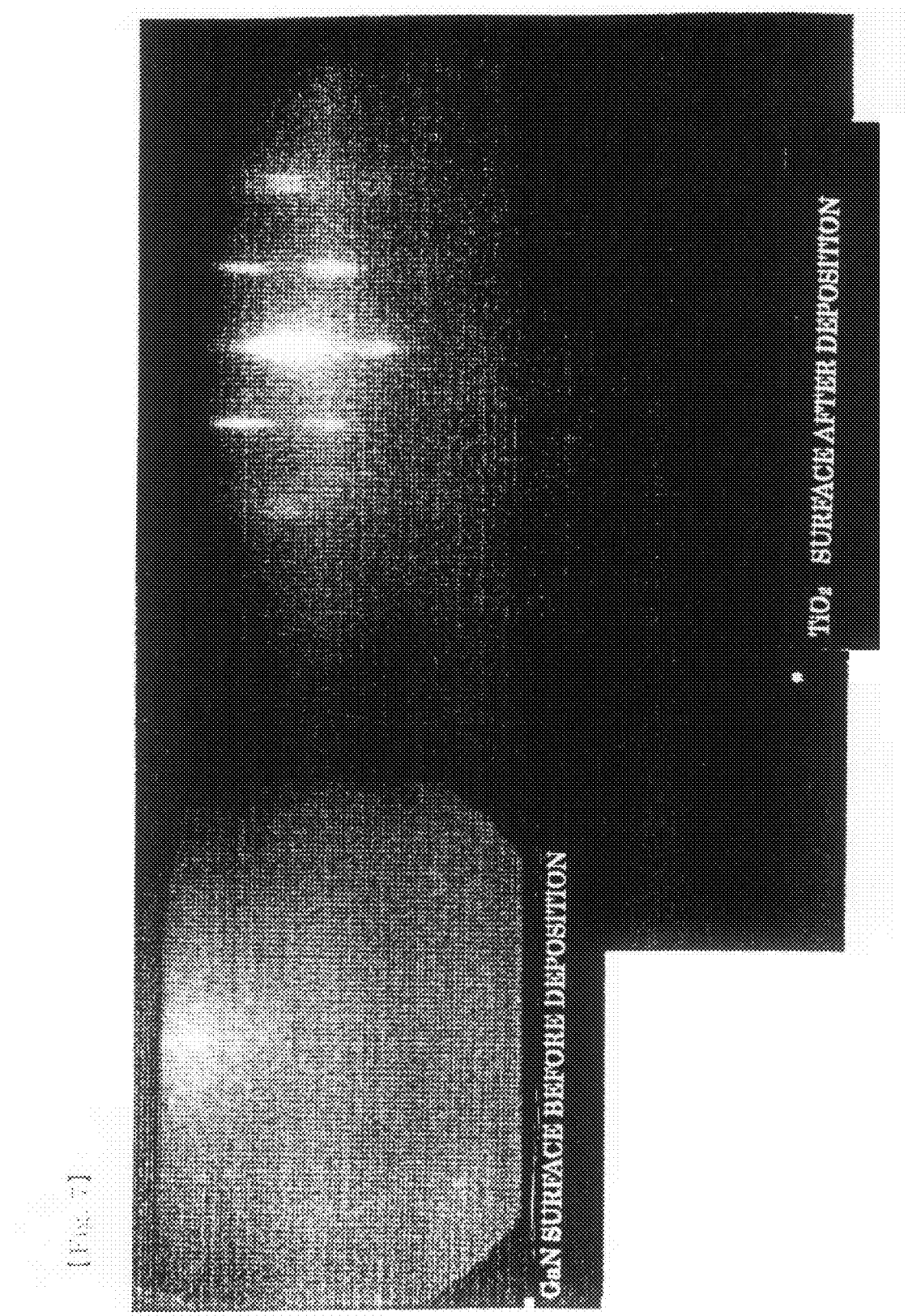
FIG. 7 is an electron diffraction image (RHEED pattern) of the surface of a $TiO_2$ film formed by a physical vapor deposition (PVD) method on a GaN substrate that is not treated with hydrochloric acid and an electron diffraction image (RHEED pattern) of the surface of the GaN substrate before deposition.

REFERENCE NUMERALS 11 substrate
12 oxide material film
30 PLD apparatus
31 chamber
32 light oscillator
33 reflector
34 lens
36 infrared lamp
39 target
40 oil-sealed rotary pump
41 backflow check valve
42 turbo-molecular pump
43 pressure valve
45 flow control valve for oxygen gas

BEST MODE FOR CARRYING OUT THE INVENTION

The embodiments of the present invention will be described in detail below with reference to the drawings.

As illustrated in FIG. 1, an oxide material film 12 is formed on a substrate 11.

The substrate 11 may be a GaN template having a surface 11a of (0001) plane (Si-doped n-type GaN manufactured by Technologies and Devices International, Inc. (TDI)).

The substrate 11 may be composed of $Al_xGa_yIn_zN$ (wherein $0 \leq x \leq 1$, $0 \leq y \leq 1$, and $0 \leq z \leq 1$).

The oxide material film 12 formed on the substrate 11 is composed of a metal oxide $TiO_2$.

The $TiO_2$ may be undoped or may be composed of M:$TiO_2$ (M is one element selected from the group consisting of Nb, Ta, Mo, As, Sb, Al, W, Co, Fe, Cr, Sn, Ni, Mn, and V, or a combination thereof). As described below, the dopant M of Nb, Ta, Mo, As, Sb, Al, or W may improve the electrical conductivity without decreasing the transparency. On the other hand, the dopant M of Co, Fe, Cr, Sn, Ni, Mn, or V may have a magneto-optical effect.

A method for manufacturing the oxide material film 12 will be described below.

First, a GaN substrate is treated. An example of treatment procedure is described below. A substrate is washed with acetone or ethanol. The substrate is then dipped in a high-purity hydrochloric acid (EL grade, at a concentration of 36%, Kanto Chemical Co., Inc.) for two minutes. The substrate is then transferred into pure water to remove hydrochloric acid. The substrate is then transferred into fresh pure water and is subjected to ultrasonic cleaning for five minutes. The substrate is then taken out from the pure water and is blown with a nitrogen gas to remove water. These treatments are performed at room temperature, for example.

These treatments remove oxides and organic substances from the surface of the substrate, thus exposing gallium at the substrate surface while nitrogen is unexposed. While hydrochloric acid is used herein, other acids such as aqua regia and hydrofluoric acid may be used. Furthermore, the treatment may be performed at room temperature or with a hot acid.

After these treatments, the substrate is placed in a chamber 31 described below. The surface condition of the substrate was observed by a reflection high energy electron diffraction (RHEED) method at 400° C. For comparison, FIG. 2 illustrates RHEED patterns of the substrate before and after the treatments. The RHEED image of the substrate after the treatments has a streak pattern, indicating that the substrate has a flat surface.

Ta:$TiO_2$, for example, is then deposited on a (0001) plane of the substrate 11 by a physical vapor deposition (PVD) method. In the description of the following embodiments, the vapor deposition is performed by a pulsed laser deposition (PLD) method.

In the PLD method, as illustrated in FIG. 3, the oxide material film 12 is deposited on the substrate 11 with a PLD apparatus 30. In the PLD apparatus 30, the substrate 11 and a target 39 are placed in the chamber 31. The PLD apparatus 30 includes a light oscillator 32 placed opposite the surface of the target 39 outside the chamber 31, a reflector 33 for adjusting the position of a pulsed laser beam emitted from the light oscillator 32, a lens 34 for controlling the spot diameter of the laser beam, and a gas supply unit 44 for injecting an oxygen gas into the chamber 31.

The chamber 31 is provided for manufacture of a high-quality thin film by maintaining an appropriate degree of vacuum and preventing contamination with impurities. The chamber 31 includes an infrared lamp 36 for heating the substrate. The temperature of the substrate is monitored through a window 31b with a radiation thermometer 37 placed outside the chamber 31 and is controlled to be a constant value. Furthermore, the chamber has a valve 45 for regulating the flow rate of the oxygen gas. The chamber 31 is coupled to a turbo-molecular pump 42 and a pressure valve 43 to achieve deposition under reduced pressure. For example, the pressure of the chamber 31 is adjusted within the range of $1 \times 10^{-7}$ to $1 \times 10^{-4}$ torr in an oxygen atmosphere with the valve 45 for regulating the flow rate of the oxygen gas and the pressure valve 43. The turbo-molecular pump 42 is coupled to an oil-sealed rotary pump 40 and a backflow check valve 41. The pressure of the turbo-molecular pump 42 is maintained at $1 \times 10^{-3}$ torr or less on the exhaust side.

The chamber 31 also includes a window 31a opposite the target 39. A pulsed laser beam emitted from the light oscillator 32 enters the chamber 31 through the window 31a. For example, the light oscillator 32 emits a KrF excimer laser having a pulse frequency in the range of 1 to 10 Hz, a laser power of 100 mJ/pulse, and a wavelength of 248 nm as the pulsed laser beam. The pulsed laser beam is adjusted by the reflector 33 and the lens 34 such that the focal position is located in the vicinity of the target 39 placed in the chamber 31, and reaches the target 39 at an angle of about 45° through the window 31a.

The target 39 may be formed of a Ta:TiO$_2$ sintered compact. While the substituting metal used herein is tantalum, the substituting metal may be Nb, Mo, As, Sb, or W or a combination of metals. The Ta:TiO$_2$ sintered compact is prepared by mixing a TiO$_2$ powder and a Ta$_2$O$_5$ powder at a desired atomic ratio and heating the mixed powder. The target 39 is placed substantially parallel to the (0001) plane of the substrate 11.

When the target 39 is formed of a Nb:TiO$_2$ sintered compact, the Nb:TiO$_2$ sintered compact is prepared by mixing a TiO$_2$ powder and a Nb$_2$O$_5$ powder at a desired atomic ratio and heating the mixed powder. When the target 39 is formed of a Co,Nb:TiO$_2$ sintered compact, the Co,Nb:TiO$_2$ sintered compact is prepared by mixing a TiO$_2$ powder, a Nb$_2$O$_5$ powder, and a CoO powder at a desired atomic ratio and heating the mixed powder.

A deposition process based on the PLD method is described below.

First, a pretreated substrate 11 is placed in the chamber 31.

Deposition may be performed for 40 minutes at a pulse Frequency of 2 Hz, a laser power of 100 mJ/pulse, an oxygen partial pressure of $1 \times 10^{-5}$ torr, and a substrate temperature of 400° C., while the substrate is rotated with a motor 35. The target 39 is intermittently irradiated with the pulsed laser beam while the target 39 is rotated with a rotating shaft 38. This rapidly increases the surface temperature of the target 39 and thereby generates ablation plasma. Ti, Ta, and O atoms in the ablation plasma move toward the substrate 11 while changing their states through repeated collision with oxygen gas in the chamber 31. After particles including Ti, Ta, and O atoms reach the substrate 11, the particles diffuse across the (0001) plane of the substrate 11. The particles form a thin film in the most stable state under a lattice-matching condition. The substrate is then quenched to room temperature at an oxygen partial pressure of $1 \times 10^{-5}$ torr. The oxide material film 12 is thus produced.

In general, it is known that lattice mismatch between a thin film and a substrate has a large influence on the formation of a crystal defect in the thin film in heteroepitaxial growth. The lattice mismatch is expressed by the following equation:

lattice mismatch=($a$film−$a$sub)/$a$sub wherein $a$film denotes the lattice constant of a thin film and $a$sub denotes the lattice constant of a substrate crystal. The lattice mismatch increases with this value, making the heteroepitaxial growth difficult. Furthermore, as illustrated in Table 1 and FIG. 4, the crystal structure of GaN is completely different from the crystal structure of TiO$_2$.

TABLE 1

|  | GaN* | Anatase | Rutile |
|---|---|---|---|
| Crystal structure | Wurtzite (hexagonal) | Anatase (tetragonal crystal) | Rutile |
| Lattice constant a-axis (nm) | 0.3189 | 0.3784 | 0.4594 |
| c-axis (nm) | 0.517 | 0.9515 | 0.2958 |
| Thermal expansion coefficient ($\times 10^{-5}$/K) | 5.59 (a-axis) | 10.2** | 7.14** (a-axis) |

(*Non-patent Document 5)
(**Non-patent Documents 6, 7, and 8)

Non-patent Document 5: The Blue Laser Diode, S. Nakamura et al., Springer

Non-patent Document 6: C, Noguchi: Sanka titan to uwagusuri toujiki titaniumu (Titanium oxide and glaze-ceramic titanium) No. 44, p. 11-13 (1956)

Non-patent Document 7: S. Kataoka: Sanka titan kougyou titaniumu zirukoniumu (titanium oxide industry titanium zirconium, vol. 12, No. 12, p. 8, 9 (1964)

Non-patent Document 8: Shinkosha web site

Thus, the formation of a TiO$_2$ film on a GaN substrate was expected to be difficult. However, contrary to this expectation, in an attempt to grow a TiO$_2$ film on a GaN substrate, it was found that the TiO$_2$ film was formed on the GaN substrate by epitaxial growth.

As described above, it was found that the oxide material film 12 could be formed by the PLD method. However, in addition to the PLD method, the oxide material film 12 may be formed by another physical vapor deposition (PVD) method, such as a molecular beam epitaxial (MBE) method or a sputtering method, or a method other than the PLD method, for example, a chemical vapor deposition (CVD) method utilizing a metal-organic chemical vapor deposition (MOCVD) method.

As illustrated in FIGS. 5(A) to 5(D), the formation of a film by a crystal growth technique is generally classified broadly into four levels according to the crystal quality ((A) level 1: a multiphase polycrystalline film, (B) level 2: a single-phase polycrystalline film, (C) level 3: a single-phase oriented epitaxial film, and (D) Level 4: a single crystal epitaxial film). In the present specification and the appended claims, a single-phase film corresponds to at least level 2, and an epitaxial film corresponds to at least level 3.

A film of at least level 2 may be formed by another physical vapor deposition (PVD) method, such as a molecular beam epitaxial (MBE) method or a sputtering method, or a method other than the PLD method, for example, a chemical vapor deposition (CVD) method utilizing a MOCVD method.

FIG. 6 is an electron diffraction image (RHEED pattern) of the surface of a TiO$_2$ film formed by the PVD method on the GaN substrate treated with hydrochloric acid and an electron diffraction image (RHEED pattern) of the surface of the GaN substrate before deposition. FIG. 7 is an electron diffraction image (RHEED pattern) of the surface of a $TiO_2$ film formed by the PVD method on a GaN substrate that is not treated with hydrochloric acid film and an electron diffraction image (RHEED pattern) of the surface of the GaN substrate before deposition.

A streak pattern clearly observed on the surface of the $TiO_2$ film indicates the occurrence of epitaxial growth. In combination with X-ray diffraction (XRD), this result shows that a film of at least level 3 can be formed by the PLD method.

Furthermore, in the treated GaN substrate, a streak pattern of the RHEED image indicates that the resulting $TiO_2$ film is flat and has excellent crystallinity.

FIG. 8 is an atomic force microscope (AFM) image of the surface of a $TiO_2$ film formed by the PVD method on the GaN substrate treated with hydrochloric acid. The mean surface roughness was 0.2 nm. This indicates that the resulting $TiO_2$ film is extremely flat.

In FIGS. 6, 7, and 8, the substrate temperature during deposition is 400° C., and the $TiO_2$ films are doped with 1% Ta. Furthermore, even when a $TiO_2$ film is not doped with another element, a clear streak pattern is observed.

The characteristics of an $M:TiO_2$ layer thus prepared are described below.

Table 2 shows the characteristics of $Ta:TiO_2$ formed on the GaN substrate.

TABLE 2

| Target | Substrate | Sub. Temp. | Oxygen Pressure | Color Resistance |
|---|---|---|---|---|
| Ta 1% $TiO_2$ | GaN (0001) | 550° C. | $1 \times 10^{-5}$ Torr | Transparent 10 KΩ |
| Ta 1% $TiO_2$ | GaN (0001) | 400° C. | $1 \times 10^{-5}$ Torr | Transparent several KΩ |
| Ta 1% $TiO_2$ | GaN (0001) | 320° C. | $1 \times 10^{-5}$ Torr | Transparent R < 1 KΩ |
| Ta 1% $TiO_2$ | GaN (0001) | 450° C. | $1 \times 10^{-5}$ Torr | Transparent R = 1 KΩ |

The resistance was measured with a volt-ohm-milliammeter.

As shown in Table 2, the substrate temperature during deposition is preferably in the range of 320° C. to 550° C. to reduce the resistance. Furthermore, the substrate temperature during deposition is preferably in the range of 320° C. to 450° C. to further reduce the resistance. The temperature in the range of 320° C. to 550° C. is lower than a typical temperature (at least 700° C.) used in a metal-organic chemical vapor deposition method (MOCVD method) or a molecular beam epitaxy method (MBE method), which is a main crystal growth technique for nitride. Thus, the substrate temperature in the range of 320° C. to 550° C. is also preferred because of less damage to the substrate. Furthermore, deposition at lower temperatures can also avoid problems caused by thermal strain in a process of cooling a sample. In consideration of a combination with another material, low-reactive low-temperature growth is desired. From these viewpoints, the substrate temperature during deposition is more preferably in the range of 320° C. to 400° C. Furthermore, there is a high probability that a film will be formed in the range of room temperature and 320° C.

$Al_xGa_yIn_zN$ is often used as a semiconducting material in optical semiconductors, such as light-emitting diodes and semiconductor lasers, and electronic devices, such as power devices and light-emitting elements. An oxide material film 12 according to the present invention may be used as a transparent electrode to increase the luminous efficiency without changing the inner structure. The refractive indexes of GaN, $TiO_2$, and ZnO are about 2.5, about 2.5, and about 2.0, respectively. A combination of GaN and a transparent electrode $TiO_2$ therefore reflects less light at the interface than a combination of GaN and a transparent electrode ZnO. Hence, a transparent $TiO_2$ electrode is advantageous to increase the luminous efficiency. $TiO_2$ may be doped with another element to reduce the difference in refractive index.

Furthermore, an oxide material film 12 according to the present invention may be applied as a transparent electrode to a surface emitting laser. In this case, because the transparent electrode can be disposed in a light-emitting area, the area of the electrode can be increased. This is also advantageous to efficient supply of electric current to an active layer.

In light-emitting elements, a transparent electrode is generally placed on a p-type semiconductor layer. However, a transparent electrode may be in contact with an n-type semiconductor layer, if necessary.

The internal transmittance and other properties of a $Nb:TiO_2$ (chemical formula: $Ti_{1-x}Nb_xO_2$) layer will be described below.

The internal transmittance (in the original meaning of transmittance, reflection must be regarded as loss; therefore, when the incident excluding reflection from the oxide material film 12 is 100% the true transmittance to the incident is hereinafter referred to as internal transmittance) of the oxide material films 12 prepared by setting the amount x of substituting Nb to 0, 0.01, 0.02, 0.03, 0.06, 0.1, 0.15, and 0.2 in $Nb:TiO_2$ (chemical formula: $Ti_{1-x}Nb_xO_2$) was measured. FIG. 9 shows that the internal transmittance was excellent, that is, at least 80%, in a visible light region (wavelength in the range of 400 to 800 nm). Particularly in a sample in which the amount x of substituting Nb is 0.06 or less, the internal transmittance is at least 95%, in the visible light region. The reason that the internal transmittance decreases with increasing amount of substituting Nb is probably that the amount of $Ti^{3+}$ increases with increasing amount of Nb substituent, and thereby the transition probability between $t_{2g}$ band and $e_g$ band, which has an absorption edge in the visible light region, increases. While the $Nb:TiO_2$ layer is formed on a strontium titanate $(SrTiO_3)$ substrate that is finished to have a surface of (100) plane, it is believed that a $Ti_{1-x-y}Co_xNb_yO_2$ layer also has the same basic physical properties (resistivity etc.) as that of the layer formed on another substrate such as a GaN substrate.

However, in the application to actual devices, the oxide material film 12 often has a thickness of at least 100 nm. In particular, the internal transmittance of ITO is required to be at least 80% for the film thickness of 100 nm or more. To meet this specification, the internal transmittance is required to be at least 95% for the film thickness of 50 nm. As illustrated in FIG. 9, this specification is satisfied when the amount x of substituting Nb is 0.06 or less. Thus, a transparent conductive thin film having an internal transmittance greater than the internal transmittance of conventional ITO thin films can be manufactured.

FIG. 10 illustrates the temperature dependence of resistivity of an oxide material film 12 containing the amount of substituting Nb described above. FIG. 10 shows that an oxide material film 12 containing the amount x of substituting Nb in the range of $0.01 \leqq x \leqq 0.2$ has an excellent conduction characteristic on the order of $10^{-4}$ Ωcm at room temperature, as compared with an oxide material film 12 free of niobium. While the $Nb:TiO_2$ layer is also formed on a strontium titanate $(SrTiO_3)$ substrate that is finished to have a surface of (100) plane, it is believed that a $Ti_{1-x-y}Co_xNb_yO_2$ layer also has the same basic physical properties (resistivity etc.) as that of the layer formed on another substrate such as a GaN substrate.

The resistivity on the order of $10^{-4}$ Ωcm can be achieved at not only the amount x of substituting Nb in the range of $\leq x \leq 0.2$, but also the amount x of substituting Nb in the range of $0.001 \leq x \leq 0.2$ in the oxide material film 12.

Furthermore, when the amount x of substituting Nb is in the range of $0.01 \leq x \leq 0.06$ in the oxide material film 12, the internal transmittance can be increased to 95%-98% for the film thickness of 50 nm (at least 80% for the film thickness of several hundred of nanometers).

Furthermore, when the amount x of substituting Nb is in the range of $0.02 \leq x \leq 0.06$ in the oxide material film 12, the resistivity can be reduced to about $5 \times 10^{-4}$ Ωcm at room temperature (280 to 300 K) and to $1 \times 10^{-4}$ Ωcm at very low temperatures (5 to 20 K) while the internal transmittance is further improved.

More specifically, use of Nb:$TiO_2$ prepared by substituting Nb for Ti sites of anatase ($TiO_2$) as an oxide material film 12 can not only improve the transparency, but also achieve low resistivity (conductivity on the order of $10^{-4}$ Ωcm) comparable to the resistivity of ITO.

Furthermore, substitution of niobium such that the resistivity of the oxide material film 12 is in the range of $2 \times 10^{-4}$ to $5 \times 10^{-4}$ Ωcm at room temperature and in the range of $8 \times 10^{-5}$ to $2 \times 10^{-4}$ Ωcm at very low temperatures can tremendously expand its applicability to various devices including display panels.

Furthermore, the oxide material film 12 can be increased in area and production by utilizing a deposition technique of $TiO_2$ exploited in photocatalysts. Application of the oxide material film 12 having a low resistivity to display panels can reduce the power consumption of the display elements, thus promoting development of larger display panels or smaller and portable display panels. Furthermore, for the reasons described above, the oxide material film 12 can not only facilitate the procurement of raw materials and reduce manufacturing costs associated with the simplification of manufacturing processes, but also save a great deal of labor associated with the production.

In other words, the application of an oxide material film 12 according to the present invention as an electrode can reduce the manufacturing costs of transparent electrodes having conventional performance, thus expanding its application range. Furthermore, use of a M:$TiO_2$ layer resistant to acid or alkaline as the oxide material film 12 can expand the application range independently of ambient environments.

Furthermore, it is a matter of course that a transparent metal 1 according to the present invention may be used not only in electrodes, but also in transparent and highly conductive parts, thin films, and devices.

The magneto-optical characteristics of a $Ti_{1-x-y}Co_xNb_yO_2$ layer thus prepared are described below.

FIG. 11 is a graph illustrating the dependence of the Faraday rotation coefficient of a $Ti_{1-x-y}Co_xNb_yO_2$ layer (the thickness of the thin film: 50 nm) on applied magnetic field at room temperature. The horizontal axis represents the applied magnetic field. The vertical axis represents the Faraday rotation coefficient. While the $Ti_{1-x-y}Co_xNb_yO_2$ layer is formed on a $(La_xSr_{1-x})(Al_xTa_{1-x})O_3$ (LSAT) substrate (the thickness of the substrate: 0.5 mm), the $Ti_{1-x-y}Co_xNb_yO_2$ layer formed on another substrate such as a GaN substrate will have the same characteristics.

A $TiO_2$ thin film containing 5% Co and 20% Nb, a $TiO_2$ thin film containing 5% Co and 10% Nb, and a $TiO_2$ thin film containing 5% Co have Faraday rotation coefficient of at least $0.1 \times 10^4$ degree/cm, which is considered to be a sufficiently practical level.

The Faraday rotation coefficient was indicated at a wave length of 400 nm in the absence of magnetic field. Furthermore, the $TiO_2$ thin film containing 5% Co and 10% Nb had a Faraday rotation coefficient of about $0.45 \times 10^4$ degree/cm. The $TiO_2$ thin film containing 5% Co and 10% Nb had a Faraday rotation coefficient about twice the Faraday rotation coefficient of a thin film free of niobium in the vicinity of 400 nm.

FIG. 12 is a graph illustrating the wavelength dependence of the Faraday rotation coefficient of a $Ti_{1-x-y}Co_xNb_yO_2$ layer (the thickness of the thin film: 50 nm) at room temperature. The horizontal axis represents the wavelength. The vertical axis represents the Faraday rotation coefficient. While this $Ti_{1-x-y}Co_xNb_yO_2$ layer is also formed on a LSAT substrate (the thickness of the substrate: 0.5 mm), the $Ti_{1-x-y}Co_xNb_yO_2$ formed on another substrate such as a GaN substrate will have the same characteristics.

A $TiO_2$ thin film containing 5% Co and 20% Nb, a $TiO_2$ thin film containing 5% Co and 10% Nb, and a $TiO_2$ thin film containing 5% Co had a Faraday rotation coefficient of at least $0.1 \times 10^4$ degree/cm at a wave length of 600 nm or less, which is considered to be a sufficiently practical level. Furthermore, in the $TiO_2$ thin film containing 5% Co and 10% Nb, the Faraday rotation coefficient is improved particularly at a wave length of 600 nm or less.

FIG. 13 is a graph of the external transmittance of a $TiO_2$ thin film containing 5% Co and 10% Nb at room temperature. The horizontal axis represents the wavelength. The vertical axis represents the transmittance.

FIG. 13 shows that light having a wavelength of at least 260 nm can pass through the thin film. Furthermore, light having a wavelength of at least 350 nm can have a transmittance of at least 70%. Light having a wavelength of at least 500 nm can have a transmittance of at least 80%. In other words, this thin film can have a transmittance in the range of about 70% to 80% in the visible light region.

As described above, an oxide material according to the present embodiment can provide a magneto-optical material useful in a short wavelength region.

Furthermore, the Faraday rotation angle can be controlled by changing the amount of niobium.

Preferably, x of $Ti_{1-x-y}Co_xNb_yO_2$ is greater than zero. This is because $Ti_{1-x-y}Co_xNb_yO_2$ may disadvantageously show no ferromagnetism at x=zero. More preferably, x is at least 0.03 to achieve spontaneous magnetization.

Preferably, y of $Ti_{1-x-y}Co_xNb_yO_2$ is in the range of $0.1 \leq y \leq 0.2$. At y=0.1, the Faraday rotation coefficient may disadvantageously be small. At y>0.2, the Faraday rotation coefficient may also disadvantageously be small.

Preferably, y of $Ti_{1-x-y}Co_xNb_yO_2$ (x=0.05) is in the range of $0 \leq y \leq 0.2$. In the absence of niobium, the Faraday rotation coefficient is disadvantageously smaller than that in the presence of niobium. At y>0.2, the Faraday rotation coefficient may also disadvantageously be small. More preferably, y is in the range of $0.1 \leq y \leq 0.2$ to achieve a larger Faraday rotation coefficient.

The physical properties of a $Ti_{1-x}Nb_xO_2$ film formed on an i-GaN substrate or a p-GaN substrate will be described below.

FIGS. 14(A) and 14(B) are graphs illustrating the composition dependence of resistivity of $TiO_2$ films doped with different amounts of niobium, formed on an i-GaN substrate (FIG. 14(A)) and a p-GaN substrate (FIG. 14(B)). The $TiO_2$ films were formed at an oxygen partial pressure of $1 \times 10^{-6}$ Torr in either substrate.

Referring to FIGS. 14(A) and 14(B), it is understood that the Nb-doping level is in the range of 1% to 15%, preferably in the range of 3% to 15%, more preferably in the range of 6% to 15%, and more preferably in the range of 6% to 10% to reduce the resistivity in either substrate.

FIGS. 15(A) and 15(B) are graphs illustrating the dependence of resistivity of a $TiO_2$ film doped with 6% Nb on substrate temperature in deposition. The $TiO_2$ film is formed on an i-GaN substrate (FIG. 15(A)) or a p-GaN substrate (FIG. 15(B)). The $TiO_2$ films were formed at an oxygen partial pressure of $1 \times 10^{-7}$ Torr in either substrate. The resistivity was measured at a temperature of 300 K.

Referring to FIGS. 14(A) and 14(B), it is understood that the substrate temperature in deposition is in the range of 350° C. to 500° C., preferably in the range of 400° C. to 500° C., more preferably in the range of 450° C. to 500° C. to reduce the resistivity in either substrate.

At a substrate temperature in the range of 350° C. to 500° C., the resistivity was lower at an oxygen partial pressure of $1 \times 10^{-7}$ Torr than at $1 \times 10^{-6}$ Torr in either substrate. Furthermore, the $TiO_2$ film doped with 6% Nb and formed on the i-GaN substrate at a substrate temperature of 450° C. and an oxygen partial pressure of $1 \times 10^{-7}$ Torr had a sheet resistance of 234 Ω/square.

FIGS. 16(A) and 16(B) are graphs illustrating the wavelength dependence of transmittance of a $TiO_2$ film doped with 6% Nb, formed on an i-GaN substrate (FIG. 16(A)) and a p-GaN substrate (FIG. 16(B)). The $TiO_2$ films were formed at an oxygen partial pressure of $1 \times 10^{-6}$ Torr in either substrate.

FIGS. 16(A) and 16(B) show that the transmittance is almost independent of the deposition temperature and the type of substrate and that the transmittance is at least 90% over a wide wavelength range.

FIGS. 17(A) and 17(B) are graphs illustrating the dependence of transmittance of a $TiO_2$ film doped with 6% Nb on substrate temperature and oxygen partial pressure. The $TiO_2$ film was formed on an i-GaN substrate (FIG. 17(A)) or a p-GaN substrate (FIG. 17(B)). The $TiO_2$ films were formed at an oxygen partial pressure of $1 \times 10^{-6}$ Torr or $1 \times 10^{-7}$ Torr in either substrate.

FIGS. 17(A) and 17(B) show that the transmittance is at least 93% at an oxygen partial pressure of $1 \times 10^{-6}$ Torr and is in the range of 75% to 80% at an oxygen partial pressure of $1 \times 10^{-7}$ Torr in either substrate.

Measurements with a deposition temperature graded film will be described below.

A deposition temperature graded film is a film having a temperature gradient formed on a substrate. For example, on one substrate, a film can be formed at a lower temperature at one end and simultaneously at a higher temperature at the other end. A deposition temperature graded film was used herein to fully examine the optimum deposition temperature.

FIG. 18 shows graphs of various measurements with a deposition temperature graded film.

FIG. 18(A) illustrates the relationship between the position on a substrate and the temperature distribution. As illustrated in FIG. 18(A), the deposition temperature changes in a longitudinal direction of the substrate. Thus, the position on the substrate in the longitudinal direction is uniquely correlated with the deposition temperature.

FIG. 18(B) illustrates the relationship between the position on a substrate and the diffraction intensity distribution determined by X-ray diffraction (XRD). This XRD mapping measurements indicate the relationship between the position on a substrate and 2θ. According to FIGS. 18(A) and 18(B), the diffraction intensity is strong at a deposition temperature of about 450° C. In other words, the crystallinity is highest at a deposition temperature of about 450° C.

FIG. 18(C) illustrates the relationship between the position on a substrate and the resistance distribution. According to FIGS. 18(A) and 18(c), the resistance is lowest at a substrate temperature of 450° C. In particular, the resistance of a film formed at 450° C. may be 25% lower than that of a film formed at 500° C. The resistance was measured by a two-terminal method.

A $SnO_2$ film formed by a PLD method will be described below.

FIG. 19 illustrates the X-ray diffraction (XRD) of a $SnO_2$ film formed on a p-GaN substrate by a PLD method. The XRD spectrum shows that the $SnO_2$ film was stably formed on the p-GaN substrate.

FIG. 20 is an electron diffraction image (RHEED pattern) of a $SnO_2$ film formed on a p-GaN substrate by the PLD method. A streak pattern clearly observed on the surface of the $SnO_2$ film indicates the occurrence of epitaxial growth. Furthermore, the streak pattern of the RHEED image indicates that the $SnO_2$ film has high crystallinity.

These $SnO_2$ films were formed at an oxygen partial pressure of $1 \times 10^{-5}$ Torr and had a film thickness of 50 nm and a resistivity of $5 \times 10^{-2}$ Ωcm$^{-1}$.

The $SnO_2$ may be undoped or may be composed of M:$SnO_2$ (M is one element selected from the group consisting of P, As, Sb, S, Se, Te, Al, Ga, In, Co, Fe, Cr, Mn, V, and Ni, or a combination thereof). The dopant M of P, As, Sb, S, Se, Te, Al, Ga, or In may improve the electrical conductivity without decreasing the transparency. On the other hand, the dopant M of Co, Fe, Cr, Mn, V, or Ni may have a magneto-optical effect.

In the near future, the wavelength used in optical communication is expected to be a shorter wavelength region, such as blue or ultraviolet light. In such a situation, this oxide material can also be used as a photomagnetic device having a large Faraday rotation coefficient at a wavelength in the vicinity of 400 nm. In particular, the Faraday rotation coefficient as large as that of presently used magnetic garnet films indicates that optical isolators suitable for next-generation communication in a short wavelength region may be manufactured with this oxide material.

The oxide material according to the present embodiment may be used not only as an optical isolator, but also in magneto-optical devices such as optical circulators, variable optical attenuators, and optical communication devices, photomagnetic devices, optical circuits, nonreciprocal optical parts, nonreciprocal optical elements, semiconductor lasers equipped with an isolator, current and magnetic field sensors, magnetic domain observation, and magneto-optical measurements.

Furthermore, examples of optical isolators include integrated modules of a laser diode (LD) and an isolator, optical isolators for fiber insertion, optical isolators for optical amplifiers, polarization-dependent optical isolators, polarization-independent optical isolators, and waveguide optical isolators. Examples of waveguide optical isolators include optical isolators with a Mach-Zehnder-type branching waveguide and optical isolators with a rib waveguide.

Optical circulators may be deflection-dependent circulators or deflection-independent circulators.

Optical isolators adaptable to a short wavelength region such as blue or ultraviolet light can be developed by applying Co-doped $TiO_2$ to light-emitting devices including a GaN compound semiconductor. The epitaxial growth of an optical isolator on a $TiO_2$ film will permit the $TiO_2$ film to function as a buffer for the crystal growth and can provide a monolithic functional device. More specifically, the epitaxial growth allows the development of not only efficient light-emitting elements and inexpensive large displays, but also monolithic functional devices, thus achieving a combination of transparent electrodes and optical devices and a combination of light-emitting devices and photomagnetic devices, for example. Furthermore, an oxide material according to the present embodiment may be used in light-receiving elements, high-frequency devices such as high electron mobility transistors (HEMT), and electronic devices.

An Al- or Sb-doped $SnO_2$ film may be used for the items described above.

While oxide materials such as $TiO_2$ films and $SnO_2$ films are described above, these oxide materials may be rutile or anatase. Anatase is preferred because of low resistivity. Rutile is preferred because it is easy to prepare. Furthermore, these oxide materials may be amorphous.

The present invention is described above with reference to the specific embodiments. However, it is obvious that modifications or substitutions of the embodiments can be made by a person skilled in the art without departing from the gist of the present invention. The present invention is disclosed by way of examples, and the present specification should not be construed as limiting the present invention. The gist of the present invention should be determined in consideration of the appended claims.

While it is obvious that the explanatory embodiments of the present invention achieve the objects described above, it is also recognized that various alterations and other examples can be made by a person skilled in the art. An element or a component of the appended claims, the specification, the drawings, and the explanatory embodiments may be employed together with another element or another component or a combination thereof. The appended claims are intended to include such alterations and other embodiments. These alterations and other embodiments are within the technical idea and the technical scope of the present invention.

INDUSTRIAL APPLICABILITY

The metal oxides having excellent characteristics can be applied to various functional devices.

The invention claimed is:

1. A functional device, comprising:
an $Al_xGa_yIn_zN$ layer (wherein $0 \leq x \leq 1$, $0 \leq y \leq 1$, and $0 \leq z \leq 1$); and
a thin film electrode of a metal oxide formed on the $Al_xGa_yIn_zN$ layer,
wherein the metal oxide is $Ti_{1-p}Nb_pO_2$ (wherein $0.01 \leq p \leq 0.2$) and has a transmittance of at least 80% for wavelength in a range of 400 to 800 nm and a resistivity in an order of $10^{-4}$ $\Omega$.cm at room temperature.

2. The functional device according to claim 1, wherein the metal oxide comprises Anatase.

3. The functional device according to claim 1, wherein the oxide material layer comprises a single-phase film.

4. The functional device according to claim 1, wherein the oxide material layer comprises an epitaxial film.

5. The functional device according to claim 1, wherein the functional device comprises a light-emitting element.

6. The functional device according to claim 1, wherein the functional device comprises a high-frequency device.

7. The functional device according to claim 1, wherein $0.01 \leq p \leq 0.06$.

8. The functional device according to claim 1, wherein said $Al_xGa_yIn_zN$ layer is a GaN layer.

* * * * *